(12) United States Patent  
Ishida

(10) Patent No.: US 9,190,363 B2  
(45) Date of Patent: *Nov. 17, 2015

(54) SEMICONDUCTOR APPARATUS AND SUBSTRATE

(71) Applicant: RENESAS ELECTRONICS CORPORATION, Kawasaki-shi, Kanagawa (JP)

(72) Inventor: Masahiro Ishida, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/475,101

(22) Filed: Sep. 2, 2014

(65) Prior Publication Data

US 2014/0367836 A1 Dec. 18, 2014

Related U.S. Application Data

(63) Continuation of application No. 13/553,579, filed on Jul. 19, 2012, now Pat. No. 8,841,784.

(30) Foreign Application Priority Data

Aug. 10, 2011 (JP) ................. 2011-174890

(51) Int. Cl.
*H01L 23/544* (2006.01)
*H01L 23/00* (2006.01)

(52) U.S. Cl.
CPC ............ *H01L 23/562* (2013.01); *H01L 23/544* (2013.01); *H01L 23/564* (2013.01); *H01L 2223/5442* (2013.01); *H01L 2223/5446* (2013.01); *H01L 2223/54426* (2013.01); *H01L2223/54453* (2013.01); *H01L 2924/0002* (2013.01); *Y10S 438/975* (2013.01)

(58) Field of Classification Search
CPC .................... H01L 23/544; H01L 2223/5442; H01L 2223/5446; H01L 2223/54453; H01L 2223/54426; H01L 23/564
USPC ........................................................ 257/797
See application file for complete search history.

(56) References Cited

U.S. PATENT DOCUMENTS 4,625,227 A 11/1986 Hara et al.
6,670,205 B1 12/2003 Byun
(Continued)

FOREIGN PATENT DOCUMENTS

JP 7-201855 A 8/1995
JP 2003-282484 A 10/2003
(Continued)

OTHER PUBLICATIONS

Office Action issued in Japanese Application No. 2011-174890 dated Mar. 31, 2015, with English translation.

*Primary Examiner* — Long K Tran
(74) *Attorney, Agent, or Firm* — McDermott Will & Emery LLP

(57) ABSTRACT

A semiconductor apparatus includes a semiconductor substrate having a main surface, a multilayer structure circuit formed over the main surface of the semiconductor substrate, a protective wall formed in the same layer as an uppermost layer of the multilayer structure circuit so as to surround the multilayer structure circuit in plan view, and an alignment mark formed in the same layer as the uppermost layer. The alignment mark is formed so as to contact at least part of the protective wall.

5 Claims, 19 Drawing Sheets

(56) References Cited

U.S. PATENT DOCUMENTS

| | | | |
|---|---|---|---|
| 7,557,439 | B1 | 7/2009 | Sasaki et al. |
| 2005/0253161 | A1 | 11/2005 | Horio et al. |
| 2005/0263855 | A1 | 12/2005 | Fu et al. |
| 2008/0023802 | A1 | 1/2008 | Suzuki |

FOREIGN PATENT DOCUMENTS

| | | |
|---|---|---|
| JP | 2006-303073 A | 11/2006 |
| JP | 2008-028243 A | 2/2008 |
| JP | 2009-164521 A | 7/2009 |
| JP | 2-077131 A | 6/2010 |
| JP | 2010-129695 A | 6/2010 |
| JP | 2011-029430 A | 2/2011 |

SEMICONDUCTOR APPARATUS AND SUBSTRATE

CROSS-REFERENCE TO RELATED APPLICATIONS

This application is a continuation of U.S. patent application Ser. No. 13/553,579, filed Jul. 19, 2012, which claims priority to Japanese Patent Application No. 2011-174890 filed on Aug. 10, 2011, the disclosures of each of which are incorporated herein by reference in their entirety.

BACKGROUND

The present invention relates to a semiconductor apparatus and substrate and in particular to a semiconductor apparatus including alignment marks and a substrate having the semiconductor apparatus formed thereon.

A single product (semiconductor apparatus) obtained by simultaneously forming, for example, multiple integrated circuits over the main surface of a single semiconductor substrate (wafer) by certain technologies is cut into multiple products (semiconductor chips) on an integrated circuit basis, typically by the technology called dicing. Formed over the main surface of the wafer are so-called alignment marks. Examples of alignment marks include alignment marks for performing alignment during so-called laser trimming (LT) (alignment marks for LT) and alignment marks for overlaying a photomask on a desired position (alignment marks for overlay). Note that while alignment marks for LT and alignment marks for overlay have different applications, they are not limited to the applications described in the specification of this application. That is, alignment marks described as alignment marks for LT may be used as alignment marks for overlay, and vice versa.

In Japanese Unexamined Patent Application Publication No. 2008-28243, for example, alignment marks are formed over lines (scribe lines) along which a wafer is to be cut during dicing. In Japanese Unexamined Patent Application Publication No. 2006-303073, for example, walls called guard rings are formed in order to control entry of moisture into integrated circuits and corrosion of the integrated circuits.

The guard rings are intended to protect the integrated circuits from the sides (peripheries). On the other hand, a protective film (such as a passivation film, or a polyimide film) may be formed in order to protect the integrated circuits from above. Covering the top surfaces of the integrated circuits with a protective film allows the integrated circuits to be protected from moisture or sediment. A semiconductor apparatus including such protective film is disclosed in, for example, Japanese Unexamined Patent Application Publication No. 2003-282484.

In Japanese Unexamined Patent Application Publication Nos. 2008-28243 and 2003-282484, alignment marks are formed in positions over scribe lines. Alternatively, alignment marks may be formed in a semiconductor chip, as disclosed in Japanese Unexamined Patent Application Publication No. 2010-129695.

In a semiconductor apparatus of Japanese Unexamined Patent Application Publication No. 2003-282484, for example, a protective film is formed in an area where scribe lines are to be formed (scribe line area). Accordingly, the protective film is cut during dicing. A crack may be formed in the protective film from cut surfaces of these films by external stress. Such a crack in the protective film is known to break the guard ring and thus reduce the moisture resistance of the integrate circuit, as well as to reduce the reliability of the semiconductor chip. For the purpose of dispersing and reducing external stress that causes such a crack or break, Japanese Unexamined Patent Application Publication No. Hei 2(1990)-77131, for example, discloses a semiconductor apparatus having slits formed in guard rings. Japanese Unexamined Patent Application Publication No. 2011-29430, for example, discloses a semiconductor apparatus including guard rings that each include two wiring layers and a via coupling the wiring layers for the same purpose. Japanese Unexamined Patent Application Publication No. 7-201855, for example, discloses a semiconductor apparatus including guard rings that each include a pattern bent in a meandering manner for the same purpose.

SUMMARY

Where alignment marks are formed in positions over scribe lines as in the semiconductor apparatuses of Japanese Unexamined Patent Application Publication Nos. 2008-28243 and 2003-282484, the alignment marks are cut by dicing. Thus, the area where the remaining alignment marks adhere to the base having them formed thereon is reduced compared to that before the dicing, reducing adhesiveness. This may cause the alignment marks to peel off from the base or curl up, causing a defect in a subsequent mounting process. Further, the remaining alignment marks may adhere to the areas between the bonding pads formed over the integrated circuits or cause a short between the bonding pads, reducing the yield or reliability of the semiconductor chip.

In the semiconductor apparatus of Japanese Unexamined Patent Application Publication No. 2010-129695, the alignment marks are formed in the semiconductor chip, solving the above-mentioned problem. However, the formation of the alignment marks in the semiconductor chip may make it difficult to reduce the size of the semiconductor chip, depending on the shape, size, position, or the like of the alignment marks. Similarly, forming guard rings in a meandering manner as in Japanese Unexamined Patent Application Publication No. Hei 7(15)-201855 may make it difficult to reduce the size of the semiconductor chip.

Forming slits or vias in guard rings as in Japanese Unexamined Patent Application Publication Nos. Hei 2(1990)-77131 and 2011-29430 makes it difficult to make the guard rings thinner when further miniaturizing the semiconductor chip. This is because forming slits or vias complicates the configuration of the guard rings.

Japanese Unexamined Patent Application Publication No. 2006-303073 discloses only the configuration of the guard rings and discloses or suggests no configuration for solving the above-mentioned problem.

An advantage of the present invention is to provide a semiconductor apparatus that is formed using alignment marks and that can control reductions in quality of semiconductor chips caused by dicing or crack and facilitate miniaturization of semiconductor chips and to provide a substrate.

In the present invention, a semiconductor apparatus includes a protective wall disposed so as to surround the circuit structure thereof, alignment marks disposed between a scribe line area (scribe line) along which a semiconductor wafer including silicon or the like is to be divided and cut into semiconductor apparatuses and the protective wall, and a protective film formed so as not to contact the scribe line area (scribe line).

A semiconductor apparatus according to a first aspect of the present invention is configured as follows.

The semiconductor apparatus includes: a semiconductor substrate having a main surface; a multilayer structure circuit formed over the main surface of the semiconductor substrate; a protective wall formed in the same layer as an uppermost layer of the multilayer structure circuit so as to surround the multilayer structure circuit in plan view; and an alignment mark formed in the same layer as the uppermost layer. The alignment mark is formed so as to contact at least part of the protective wall.

A semiconductor apparatus according to a second aspect of the present invention is configured as follows. The semiconductor apparatus includes: a semiconductor substrate having a main surface; a multilayer structure circuit formed over the main surface of the semiconductor substrate; a protective wall formed in the same layer as an uppermost layer of the multilayer structure circuit so as to surround the multilayer structure circuit in plan view; an alignment mark formed outside the protective wall in the same layer as the uppermost layer so as to be spaced from the protective wall; and a protective film covering a top surface of the uppermost layer of the multilayer structure circuit. The alignment mark is formed so as to be spaced from a section of an edge of the semiconductor substrate. The protective film covers at least part of a top surface of the alignment mark, and the protective wall.

A semiconductor apparatus according to a third aspect of the present invention is configured as follows. The semiconductor apparatus includes: a semiconductor substrate having a main surface; a multilayer structure circuit formed over the main surface of the semiconductor substrate; a protective wall formed in the same layer as an uppermost layer of the multilayer structure circuit so as to surround the multilayer structure circuit in plan view; an alignment mark formed in the same layer as the uppermost layer; and a protective film covering a top surface of the uppermost layer of the multilayer structure circuit. The alignment mark is formed so as to be spaced from a section of an edge of the semiconductor substrate. The protective film has an aperture in plan view. At least part of a top surface of the alignment mark formed outside the protective wall so as to be opposed to the aperture in plan view is covered with the protective film.

According to the first aspect of the present invention, the alignment mark is formed so as to contact the protective wall. Thus, the alignment mark is not cut when forming the semiconductor apparatus by dicing. This makes it possible to control occurrence of failures such as one where cutting of the alignment mark causes a short between bonding pads of the integrated circuit. Further, no alignment mark is formed in the chip area which is surrounded by the protective wall. Thus, the possibility can be eliminated that a reduction in size of the semiconductor chip would be prevented by the occupation of part of the chip area by the alignment mark.

According to the second embodiment of the present invention, the alignment mark is formed so as to be spaced from a section of an edge of the semiconductor substrate. Thus, the alignment mark is prevented from being cut when forming the semiconductor apparatus by dicing. This makes it possible to control occurrence of failures such as one where cutting of the alignment mark causes a short between the bonding pads of the integrated circuit. Even when at least part of the alignment mark is covered with the protective film, the alignment mark is not cut. Thus, the possibility can be reduced that there will be provided a semiconductor apparatus where a crack has been formed in the protective film during dicing. Further, no alignment mark is formed in the chip area which is surrounded by the protective wall. Thus, the possibility can be eliminated that a reduction in size of the semiconductor chip would be prevented by the occupation of part of the chip area by the alignment mark.

According to the third embodiment of the present invention, the alignment mark opposed to the aperture formed on the protective film is covered with the protective film. Thus, the protective film adjacent to the aperture is reinforced by the protective film covering the alignment mark. Thus, the possibility can be reduced that there will be a semiconductor apparatus where a crack has been formed in the protective film during dicing.

DETAILED DESCRIPTION

Now, embodiments of the present invention will be described with reference to the accompanying drawings.

First Embodiment

First, a semiconductor apparatus in a wafer state according to a first embodiment will be described.

Figure 1:
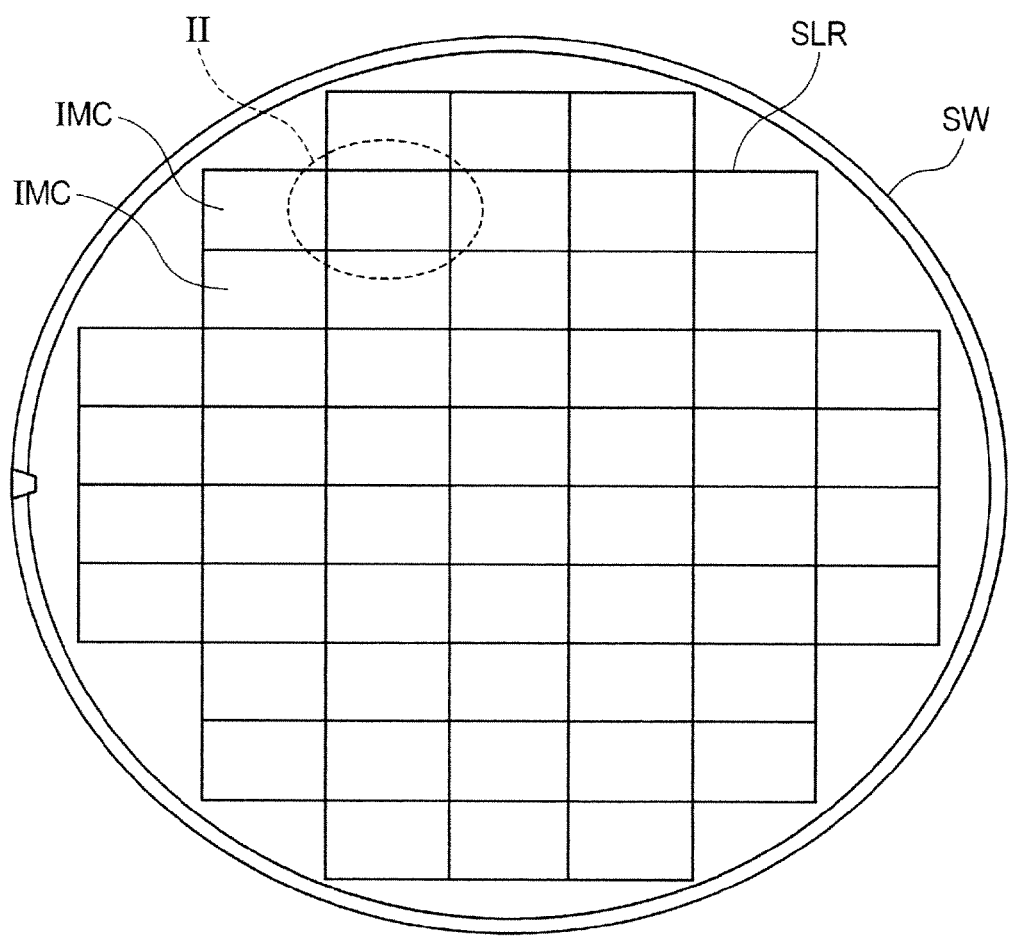
FIG. 1 is a schematic plan view showing the state of a wafer having multiple semiconductor apparatuses disposed thereover according to a first embodiment of the present invention.

Referring to FIG. 1, a semiconductor wafer SW has multiple chip areas IMC thereon. Each chip area IMC has an integrated circuit (in particular, a multilayer structure circuit) formed therein. The semiconductor wafer SW includes, for example, a semiconductor substrate formed of a semiconductor crystal such as silicon. The chip area IMCs are rectangular in plan view and arranged in an array. The chip areas IMC are surrounded by a scribe line area SLR. The scribe line area SLR is an area along which the semiconductor wafer SW is to be cut into individual semiconductor chips CHP. When divided into the chip areas IMC along the scribe line area SLR, the semiconductor wafer SW is divided into multiple semiconductor chips.

Figure 2:
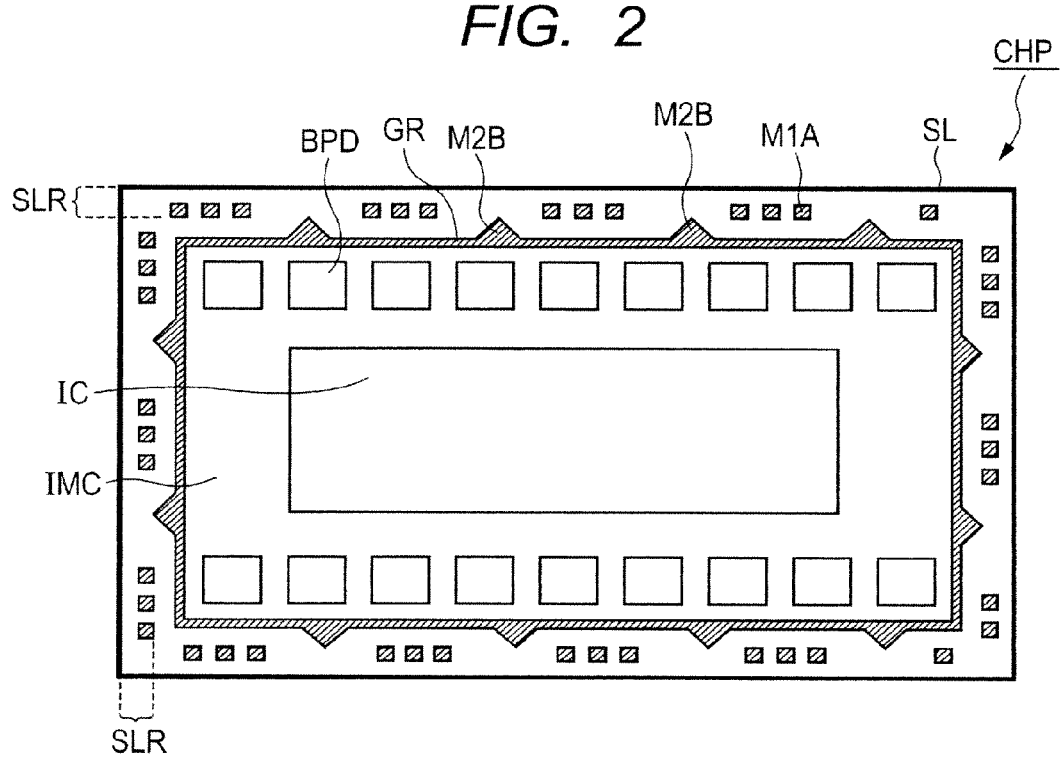
FIG. 2 is a schematic plan view showing the pattern of the uppermost layer of the multilayer structure of a semiconductor chip serving as a single semiconductor apparatus where a chip area and a scribe line area are formed and which is obtained by cutting along the scribe line area of FIG. 1 according to an first example of the first embodiment.

Next, the semiconductor apparatus in a chip state according to this embodiment will be described. Referring to FIG. 2, a semiconductor chip CHP having a single chip area INC according to a first example of this embodiment is formed by dividing the semiconductor wafer SW of FIG. 1 into chip areas INC along the scribe line area SLR. The semiconductor chip CHP has as an end surface a scribe line SL of the scribe line area SLR that is a line along which the semiconductor wafer SW has been actually cut to form the semiconductor chip CHP. Accordingly, FIG. 2 shows the pattern of an area surrounded by a circular dotted line "II" in FIG. 1 and in particular the pattern of metal wiring or the like in the uppermost layer of the area.

The semiconductor chip CHP has a chip area IMC, a guard ring GR (protective wall), and a scribe line area SLR, which are disposed in this order from inside in plan view. The chip area IMC and the scribe line area SLR are partitioned by the guard ring GR. The guard ring GR is disposed so as to be a wall that surrounds the perimeter of the chip area IMC in plan view. This can control entry of moisture into a multilayer structure circuit IC formed in the chip area IMC, controlling impairment of the multilayer structure circuit IC. The guard ring GR is, for example, rectangular in plan view as shown in the figure and surrounds the perimeter of the chip area IMC. For example, the guard ring GR has a metal wiring layer as an uppermost layer and has metal wiring layers also as layers lower than the uppermost layer (layers closer to the semiconductor substrate). These metal wiring layers are electrically coupled together via, e.g., a conductive via.

Formed in the chip area IMC are multiple bonding pads BPD. The bonding pads BPD are formed of, for example, a metallic material such as aluminum or copper. In FIG. 2, the bonding pads BPD are square in plan view but not limited thereto. They may be in any shape such as rectangle. While the multiple bonding pads BPD are arranged only in the long-side direction (the horizontal direction of the figure) of the rectangular chip area IMC in FIG. 2, they may further be arranged in the short-side direction thereof (the vertical direction of the figure). The bonding pads BPD may further be disposed over the multilayer structure circuit IC.

Formed in the area surrounded by the bonding pads BPD of the chip area IMC is the multilayer structure circuit IC. The multilayer structure circuit IC includes semiconductor devices (not shown) such as a metal insulator semiconductor (MIS) transistor and a diode. It is an integrated circuit formed by layering multiple thin-film patterns such as wiring and an insulating layer. FIG. 2 and later figures all show a thin-film pattern, such as metal wiring, serving as the uppermost layer of the multilayer structure of the multilayer structure circuit IC. The bonding pads BPD are electrically coupled to the terminals of the semiconductor devices.

Multiple alignment marks M2B, for example, are formed in the uppermost layer of the multilayer structure so as to contact at least parts of the guard ring GR. As with the uppermost layer of the guard ring GR, the alignment marks M2B in the uppermost layer of the multilayer structure are preferably a pattern of a metal wiring layer made of aluminum or the like. The alignment marks M2B are triangular in plan view. Since the alignment marks M2B are formed so as to contact at least parts of the guard ring GR, the alignment marks M2B are spaced from the scribe line SL. That is, the alignment marks M2B are formed in such a manner that the pattern thereof is not exposed to a section of the end surface of the semiconductor chip CHP which is along the scribe line SL. In FIG. 2, the alignment marks M2B contact both the long sides and the short sides of the guard ring GR, which is rectangular in plan view. Alternatively, for example, they may contact only the long sides thereof.

Further, multiple alignment marks M1A, for example, may be formed in the scribe line area SLR located outside the guard ring GR in such a manner that the alignment marks M1A are spaced from the guard ring GR (that is, in such a manner that the alignment marks M1A do not contact the guard ring GR). The alignment marks M1A are rectangular (e.g., square) in plan view. The alignment marks M1A are also formed in such a manner that the alignment marks M1A are spaced from the scribe line SL. That is, the alignment marks M1A are formed in such a manner that the pattern thereof is not exposed to a section of the end surface of the semiconductor chip CHP which is along the scribe line SL.

The alignment marks M2B and the alignment marks M1A shown in FIG. 2 are alignment marks in the uppermost layer of the multilayer structure circuit formed in the chip area IMC. That is, the alignment marks M2B and the alignment marks M1A are alignment marks for laser trimming (LT). Laser trimming is a technology that applies a laser to, for example, a fuse wire (not shown) formed as part of the multilayer structure circuit IC to melt and cut the fuse wire. During laser trimming, the alignment marks M2B and M1A for LT are used to adjust the position to which a laser is to be applied.

In FIG. 2, the alignment marks M2B and the alignment marks M1A are disposed so as not to be opposed to each other in the directions in which the guard ring GR extends in plan view (in the horizontal and vertical directions of the figure). Alternatively, for example, the alignment marks M2B and the alignment marks M1A may be disposed so as to be opposed to each other in the above-mentioned directions.

Figure 3:
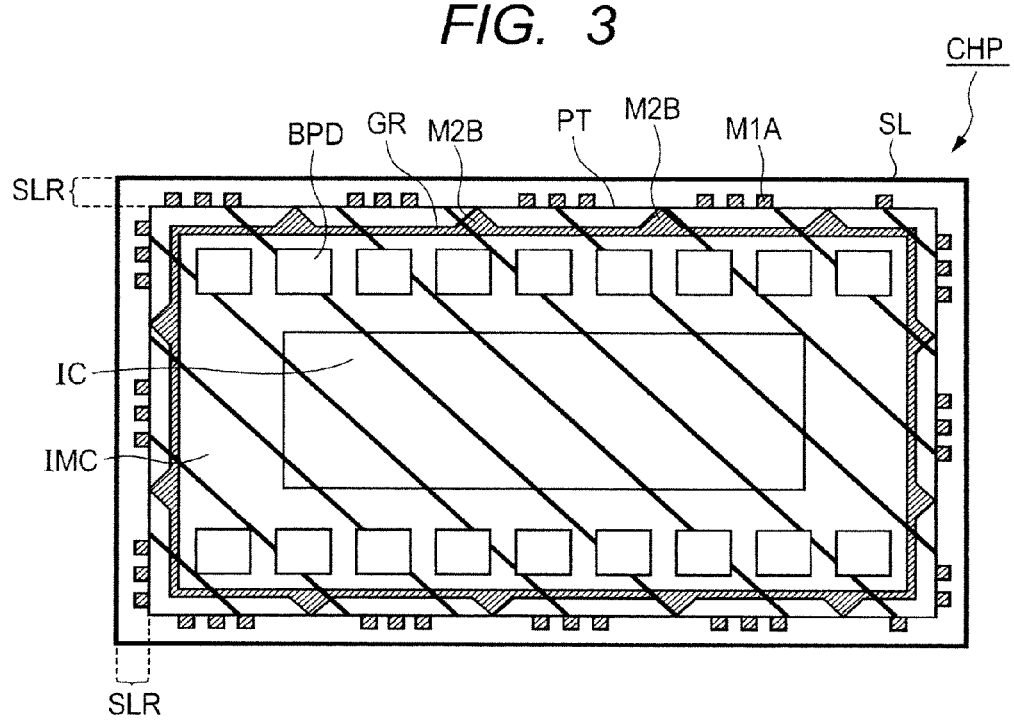
FIG. 3 is a schematic plan view showing the pattern of the uppermost layer of the multilayer structure of a semiconductor chip serving as a single semiconductor apparatus where a chip area and a scribe line area are formed and which is obtained by cutting along the scribe line area of FIG. 1 according to an second example of the first embodiment.

Referring to FIG. 3, a semiconductor chip CHP according to a second example of this embodiment has substantially the same configuration as the semiconductor chip CHP of FIG. 2. In the semiconductor chip CHP of FIG. 3, however, the top surface of the pattern of metal wiring or the like in the uppermost layer of the multilayer structure is covered with a protective film PT. In this regard, the semiconductor chip CHP of FIG. 3 differs from that of FIG. 2.

The protective film PT may be composed of a single layer of silicon nitride film serving as a passivation film, or may be composed of a multilayer of the passivation film and, e.g., a polyimide thin film. The protective film PT is formed in order to protect the multilayer structure circuit IC of the semiconductor chip CHP from above to prevent entry of moisture or the like into the multilayer structure circuit IC. Accordingly, the protective film PT is formed so as to cover the chip area IMC from above.

Specifically, the protective film PT is formed so as to cover the guard ring GR and the alignment marks M2B contacting at least parts of the guard ring GR from above. In this case, the protective film PT may be formed so as to cover the entire alignment marks M2B in plan view or may be formed so as to cover part thereof in plan view. Note that the protective film PT is formed so as not to cover the entire scribe line area SLR (in particular, the area shown by the scribe line SL and to be cut by a dicing machine).

Since the protective film PT is not formed directly above the area where the bonding pads BPD are formed, the surfaces of the bonding pads BPD are exposed. That is, the protective film PT has apertures in the areas where the protective film PT and the bonding pads BPD overlap each other in plan view. Accordingly, the bonding pads BPD can electrically be coupled to the transistor, diode, or the like.

Figure 4:
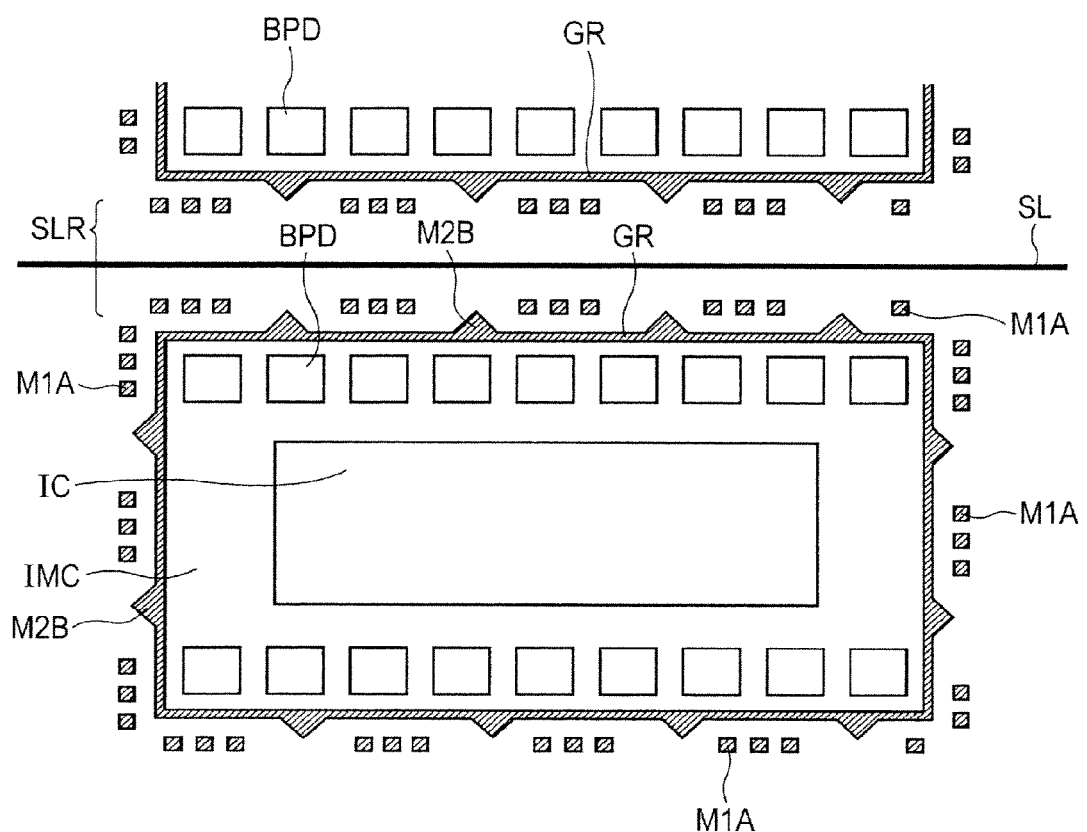
FIG. 4 is a schematic plan view showing the pattern of the uppermost layer of the multilayer structure of the semiconductor wafer where chip areas and a scribe line area are formed and where semiconductor apparatuses are disposed according to the first second example of the first embodiment.

FIG. 4 and subsequent figures show an area including a chip area IMC and the like, as part of the semiconductor wafer SW which has yet to be diced. Referring to FIG. 4, the semiconductor wafer SW has thereon aligned multiple chip areas IMC and a scribe line area SLR interposed between the chip areas IMC. During dicing, a scribe line SL is formed in part of the scribe line area SLR, and the semiconductor wafer SW is divided into the semiconductor chips CHP along the scribe line SL.

Figure 5:
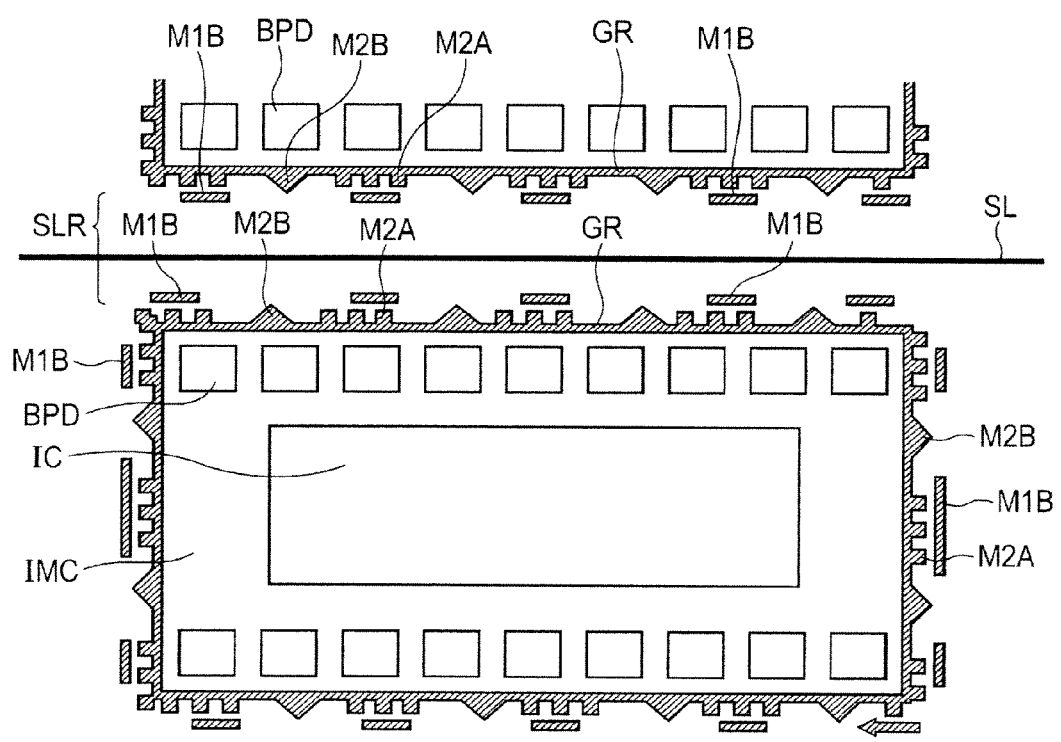
FIG. 5 is a schematic plan view showing the pattern of the uppermost layer of the multilayer structure of a semiconductor wafer where chip areas and a scribe line area are formed and where semiconductor apparatuses are disposed according to a third example of the first embodiment.

Referring to FIG. 5, metal wiring or the like in the uppermost layer of the area where chip areas IMC and the like are formed, of a semiconductor wafer according to a third example of this embodiment has basically the same configuration as that according to the first example thereof shown in FIG. 4. In FIG. 5, however, multiple alignment marks M2A for LT, as well as multiple alignment marks M2B, are formed in the uppermost layer of the multilayer structure so as to contact at least parts of the guard ring GR. The alignment marks M2A are rectangular (e.g., square) in plan view. Further, alignment marks M1B for LT, for example, are formed in such a manner that the alignment marks M1B are spaced from the guard ring GR.

The alignment marks M1B are formed in the scribe line area SLR so as to be opposed to the alignment marks M2A in plan view. The alignment marks M1B are formed in such a manner that the alignment marks M1B are spaced from the scribe line SL. That is, the alignment marks M1B are formed in such a manner that the pattern thereof is not exposed to a section of the end surface of the semiconductor chip CHP which is along the scribe line SL. While the alignment marks M1B are each in the shape of a long rectangle in FIG. 5, the shape thereof in plan view is not limited thereto. The alignment marks M2A are formed in such a manner that the alignment marks M2A are spaced from the scribe line SL and in such a manner that they contact at least parts of the guard ring GR.

As with the uppermost layers of the alignment marks M2B and the guard ring GR, the alignment marks M1A, M1B, and M2A in the uppermost layer of the multilayer structure are preferably a pattern of a metal wiring layer made of aluminum or the like.

In FIG. 5, the alignment marks M1B and alignment marks M2A are disposed so as to be opposed to each other in the directions in which the guard ring GR extends in plan view (in the horizontal and vertical directions of the figure). Alternatively, for example, the alignment marks M1B and the alignment marks M2B may be disposed so as to be opposed to each other.

Figure 6:
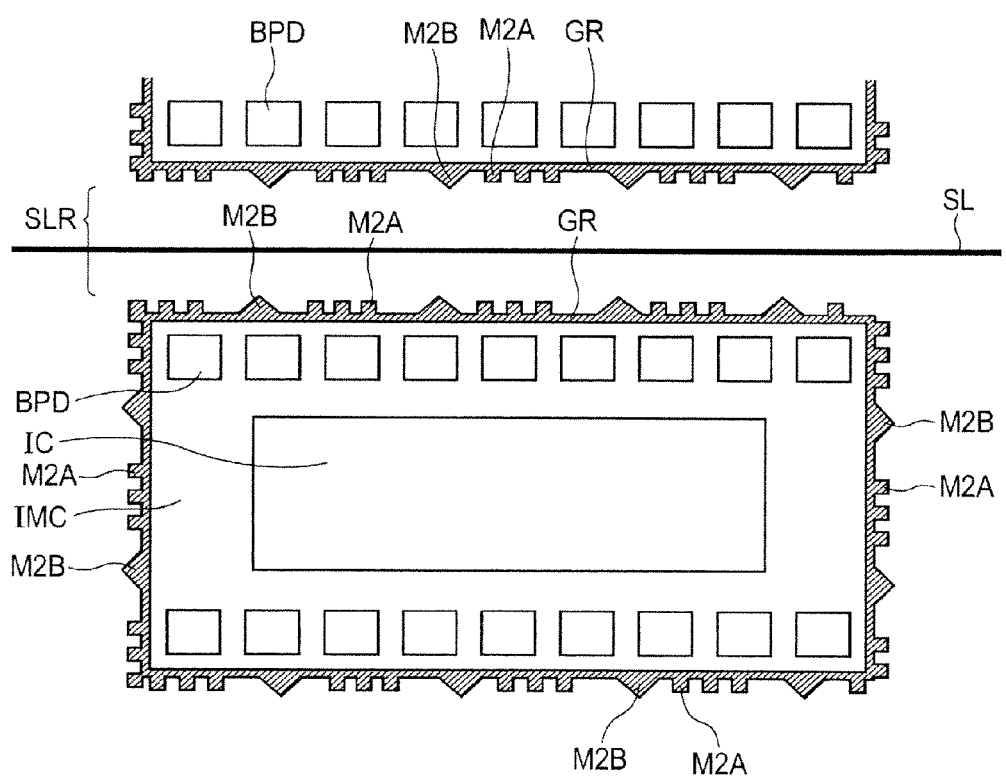
FIG. 6 is a schematic plan view showing the pattern of the uppermost layer of the multilayer structure of a semiconductor wafer where chip areas and a scribe line area are formed and where semiconductor apparatuses are disposed according to a fourth example of the first embodiment.

Referring to FIG. 6, metal wiring or the like in the uppermost layer of the area where chip areas IMC and the like are formed, of a semiconductor wafer according to a fourth example of this embodiment has basically the same configuration as that according to the third example thereof shown in FIG. 5. In FIG. 6, however, the alignment marks M1B of FIG. 5 are not formed, and only the alignment marks M2A and M2B contacting at least parts of the guard ring GR are formed as alignment marks for LT in the uppermost layer. As seen, the semiconductor wafer may include only the alignment marks M2A and M2B contacting at least parts of the guard ring GR.

Figure 7:
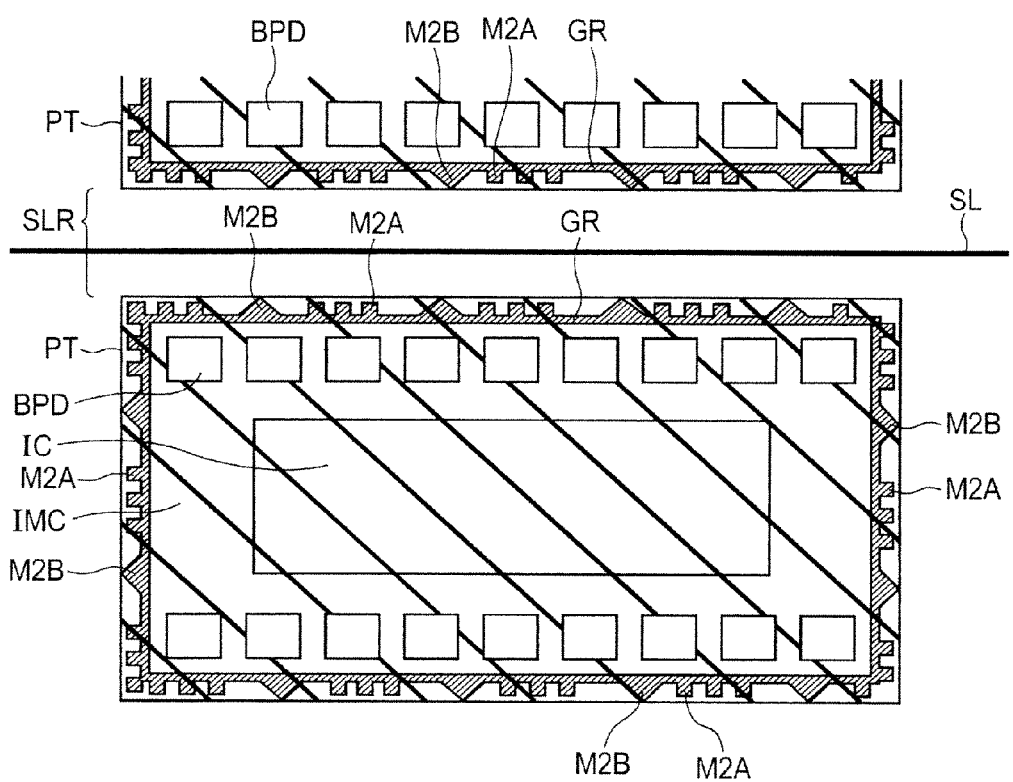
FIG. 7 is a schematic plan view showing the pattern of the uppermost layer of the multilayer structure of a semiconductor wafer where chip areas and a scribe line area are formed and where semiconductor apparatuses are disposed according to a fifth example of the first embodiment.

Referring to FIG. 7, metal wiring or the like in the uppermost layer of the area where chip areas IMC and the like are formed, of a semiconductor wafer according to a fifth example of this embodiment has basically the same configuration as that according to the fourth example thereof shown in FIG. 6. In FIG. 7, however, the top surface of a pattern of metal wiring or the like in the uppermost layer of the multilayer structure is covered with a protective film PT. The protective film PT is formed so as to cover the guard ring GR and the alignment marks M2A and M2B contacting at least parts of the guard ring GR from above. In this case, the protective film PT may be formed so as to cover the entire alignment marks M2B in plan view or may be formed so as to cover part thereof in plan view. Note that the protective film PT is formed so as not to cover the entire scribe line area SLR (in particular, the area shown by the scribe line SL and to be cut by a dicing machine).

Next, advantageous effects of this embodiment will be described. In the examples of this embodiment, the alignment marks M2A and M2B are formed so as to contact at least parts of the guard ring GR. Thus, the alignment marks M2A and M2B are disposed to a lesser extent than the extent to which the alignment marks M1A and M1B are spaced from the guard ring GR. If a combination of the alignment marks M2A and M2B formed so as to contact at least parts of the guard ring GR in plan view, and the guard ring GR is regarded as a guard ring area, the semiconductor chip CHP according to this embodiment has a configuration where the chip area IMC, the guard ring area, and the scribe line area SLR are disposed in this order from inside in plan view. While part of the guard ring area, the alignment marks M2A and M2B, may enter the scribe line area SLR, the possibility is reduced that the alignment marks M2A and M2B will be disposed in positions spaced outwardly from the guard ring GR so that they reach the scribe line SL.

Thus, the possibility is reduced that the alignment marks M2A and M2B will be cut by a dicing machine during dicing. This makes it possible to control occurrence of mounting failures such as one where an alignment mark M2A or M2B peeled off due to cutting by a dicing machine electrically couples a pair of adjacent bonding pads BPD and causes a short therebetween. This also makes it possible to control occurrence of mounting failures such as one where a peeled-off alignment mark M2A or M2B adheres to a portion of the multilayer structure circuit IC and causes a short in the portion.

This also makes it possible to control a phenomenon where adherence of an alignment mark M2A or M2B to the top portion of the chip area IMC disturbs the flatness of the top surface of the chip area IMC and thus impairs the channel for a resin or the like used to package the semiconductor apparatus, making a void in the resin. As a result, the quality of the semiconductor apparatus to be formed can be improved.

Further, contacting the alignment marks M2A and M2B with at least parts of the guard ring GR reduces the need to dispose the alignment marks M2A and M2B in the chip area IMC. All the alignment marks M2A and M2B according to this embodiment are disposed so as to contact the outside of the guard ring GR. Thus, the possibility is reduced that the alignment marks M2A and M2B will occupy part of the chip area IMC in plan view and thus make difficult the miniaturization (downsizing) of the semiconductor chip CHP including the chip area IMC. That is, further downsizing (miniaturization) of the semiconductor chip CHP (chip area IMC) can easily be accomplished.

Further, in FIGS. 3 and 7, the protective film PT (e.g., a passivation film and a polyimide film) covers the top surface of the chip area IMC, as well as the guard ring area, that is, the alignment marks M2A and M2B contacting the guard ring GR. Such protection of the alignment marks M2A and M2B by the protective film PT from above can control occurrence of problems such as peeling off thereof.

Note that, as described above, the protective film PT is formed so as to cover the guard ring area including the alignment marks M2A and M2B but so as not to cover the entire scribe line area SLR (in particular, the area shown by the scribe line SL and to be cut by a dicing machine). Thus, for example, the protective film PT is prevented from being cut by a dicing machine during dicing. This makes it possible to control occurrence of problems such as one that a crack occurs in the protective film PT from a cut surface thereof and thus reduces the effect of the protective film PT of protecting the multilayer structure circuit IC against moisture.

Further, alignment marks which are triangular in plan view, such as the alignment marks M2B, can increase, for example, the effect of dispersing and reducing external stress applied to the guard ring GR when sealing the semiconductor chip CHP with a resin in a subsequent process. Such reduction in the stress applied to the guard ring GR controls occurrence of a crack attributable to the external stress. This further increases the effect of controlling entry of moisture into the chip area IMC (e.g., the multilayer structure circuit IC), for example, from the crack.

Second Embodiment

Figure 8:
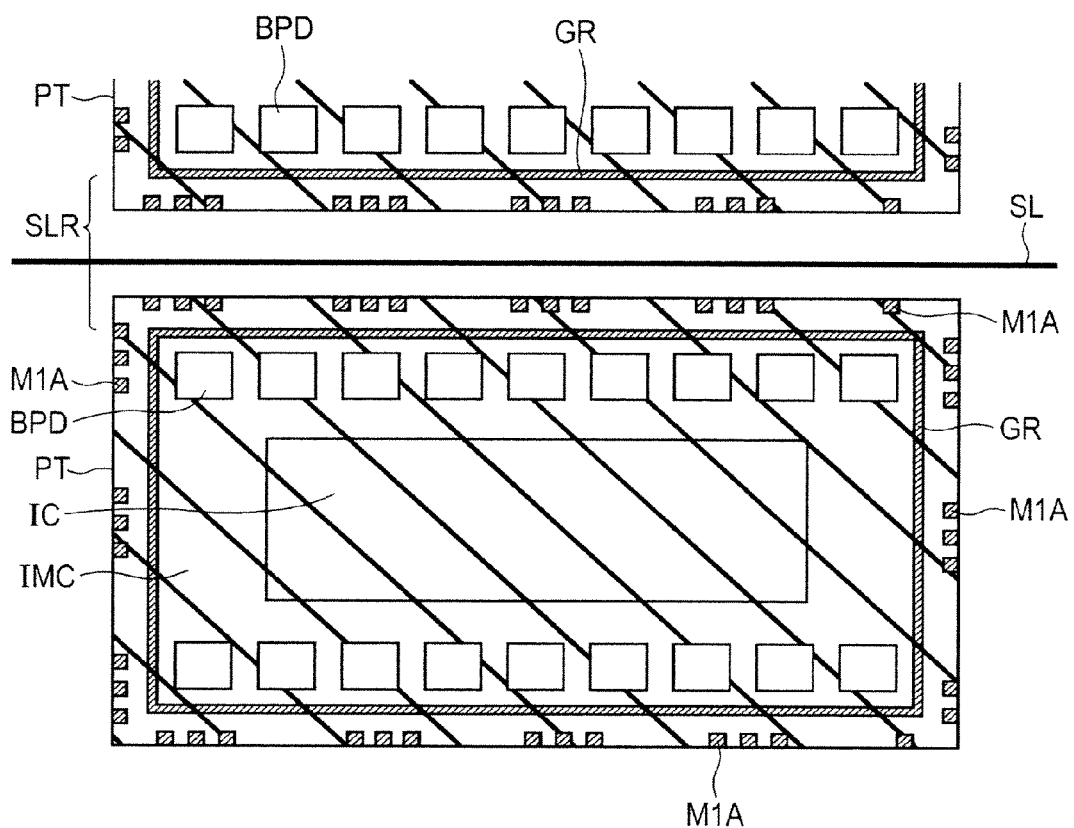
FIG. 8 is a schematic plan view showing the pattern of the uppermost layer of the multilayer structure of a semiconductor wafer where chip areas and a scribe line area are formed and where semiconductor apparatuses are disposed according to a second embodiment.

A second embodiment differs from the first embodiment in the configuration of alignment marks. Referring now to FIG. 8, the configuration of this embodiment will be described.

Referring to FIG. 8, in the uppermost layer of the area where a chip area IMC and the like are formed, of a semiconductor moisture according to this embodiment, multiple alignment marks M1A are formed in the scribe line area SLR located outside the guard ring GR in such a manner that the alignment marks M1A are spaced from the guard ring GR (that is, in such a manner that the alignment marks M1A do not contact the guard ring GR). The alignment marks M1A of FIG. 8 have a similar configuration to those according to the first embodiment. That is, the alignment marks M1A may enter the scribe line area SLR but are formed in such a manner that the alignment marks M1A are spaced from the scribe line SL (a section of an edge of the semiconductor chip CHP).

In this embodiment, there are no alignment marks for LT that are formed so as to contact at least parts of the guard ring GR and that correspond to the alignment marks M2A and M2B according to the first embodiment. Instead of marks that are square in plan view, such as the alignment marks M1A, marks that are rectangular in plan view, such as the alignment marks M1B, may be used.

In FIG. 8, the alignment marks M1A are disposed in such a manner that sets of three alignment marks M1A are made in the directions in which the guard ring GR extends (in such a manner that the distance between sets of three alignment marks M1A is larger than the distance between the alignment marks M1A in each set in the extending directions). Note that the distance between adjacent alignment marks M1A is optional and the alignment marks M1A may be disposed in such a manner that the distances between all adjacent alignment marks are approximately the same.

In FIG. 8, the top surface of the pattern of metal wiring or the like in the uppermost layer of the multilayer structure is covered with a protective film PT. As in the first embodiment, the protective film PT may be composed of a single layer of silicon nitride film serving as a passivation film, or may be composed of a multilayer of a passivation film and, e.g., a polyimide thin film.

The protective film PT is formed so as to cover the guard ring GR and the alignment marks M1A (M1B) from above. In this case, the protective film PT may be formed so as to cover the entire alignment marks M1A (M1B) in plan view or may be formed so as to cover parts thereof in plan view. That is, the protective film PT is formed so as to cover at least parts of the top surfaces of the alignment marks M1A (M1B) and the guard ring GR. Note that the protective film PT is formed so as not to cover the entire scribe line area SLR (in particular, the area shown by the scribe line SL and to be cut by a dicing machine).

The configuration of this embodiment is the same as that of the first embodiment except for the above-mentioned points. Accordingly, the same components are given the same reference signs and will not be described again.

Next, advantageous effects of this embodiment will be described. As seen in this embodiment, even when the alignment marks M1A for LT are spaced from the guard ring GR, the alignment marks M1A are not cut by a dicing machine as long as they are formed in such a manner that the alignment marks M1A are spaced from a section of an edge of the semiconductor chip CHP. Thus, as with the first embodiment, this embodiment can control occurrence of mounting failures such as one where an alignment mark M1A peeled off due to cutting by a dicing machine electrically couples a pair of adjacent bonding pads BPD and thus causes a short therebetween. This embodiment can also control occurrence of mounting failures such as one where adherence of a peeled-off alignment mark M1A to part of the multilayer structure circuit IC causes a short in the part.

This embodiment can also control a phenomenon where adherence of an alignment mark M1A to the top portion of the chip area IMC disturbs the flatness of the top surface of the chip area IMC and thus impairs the channel for a resin or the like used to package the semiconductor apparatus, making a void in the resin. As a result, the quality of the semiconductor apparatus to be formed can be improved.

Further, in this embodiment, the alignment marks M1A (M1B) are disposed outside the chip area IMC (the area surrounded by the guard ring GR). Thus, as in the first embodiment, the possibility is reduced that the alignment marks M1A (M1B) will occupy part of the chip area IMC in plan view and thus make difficult the miniaturization (downsizing) of the semiconductor chip CHP including the chip area IMC. That is, further downsizing (miniaturization) of the semiconductor chip CHP (chip area IMC) can easily be accomplished.

Further, in this embodiment, the protective film PT covering the multilayer structure circuit IC of the chip area IMC from above covers at least parts of the alignment marks M1A (M1B), and the guard ring GR. Such protection by the protective film PT from above can control occurrence of problems such as peeling off of the alignment marks M1A (M1B).

As described above, the alignment marks M1A (M1B) are not cut by a dicing machine. As a result, even when the alignment marks M1A (M1B) are covered with the protective film PT, the possibility is reduced that the protective film PT will be cut during dicing and a cut surface thereof will serve as the starting point of a crack. This can increase the effect of controlling entry of moisture into the chip area IMC (e.g., the multilayer structure circuit IC), for example, from the above-mentioned crack.

The second embodiment differs from the first embodiment in only the above-mentioned points. That is, the configuration, conditions, steps, advantages, and the like of the second embodiment that are not described above are all the same as those of the first embodiment.

Third Embodiment

Figure 9:
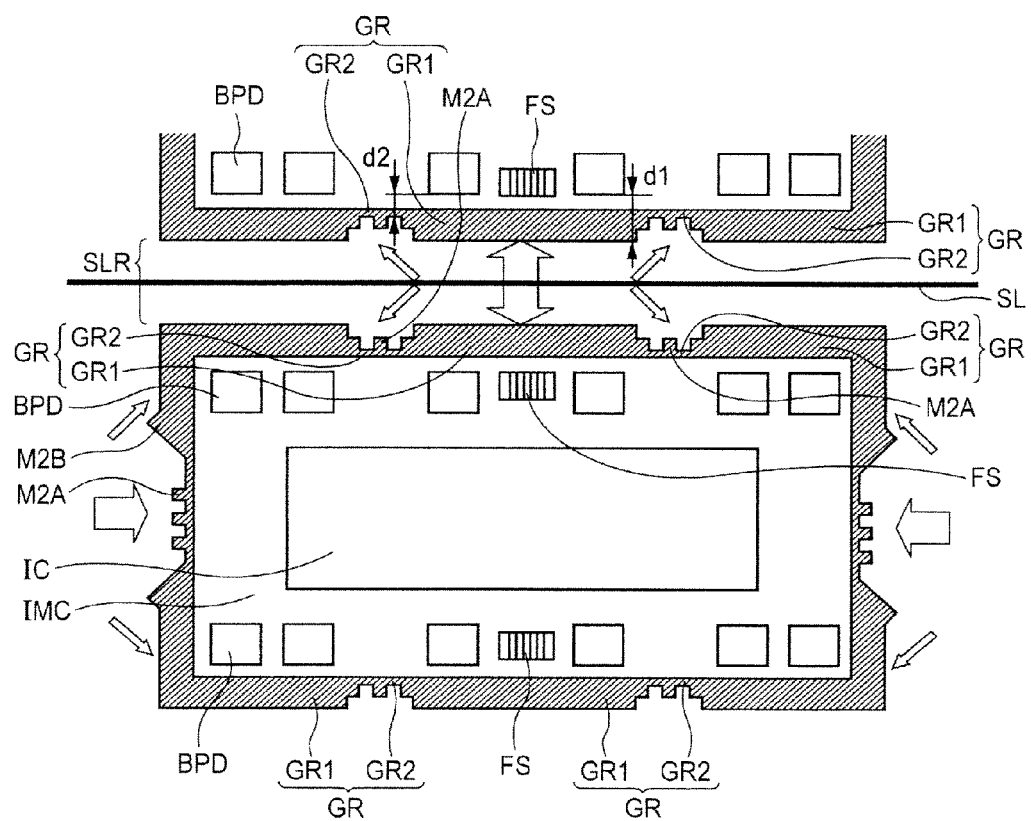
FIG. 9 is a schematic plan view showing the pattern of the uppermost layer of the multilayer structure of a semiconductor wafer where chip areas and a scribe line area are formed and where semiconductor apparatuses are disposed according to a first example of a third embodiment.
Figure 10:
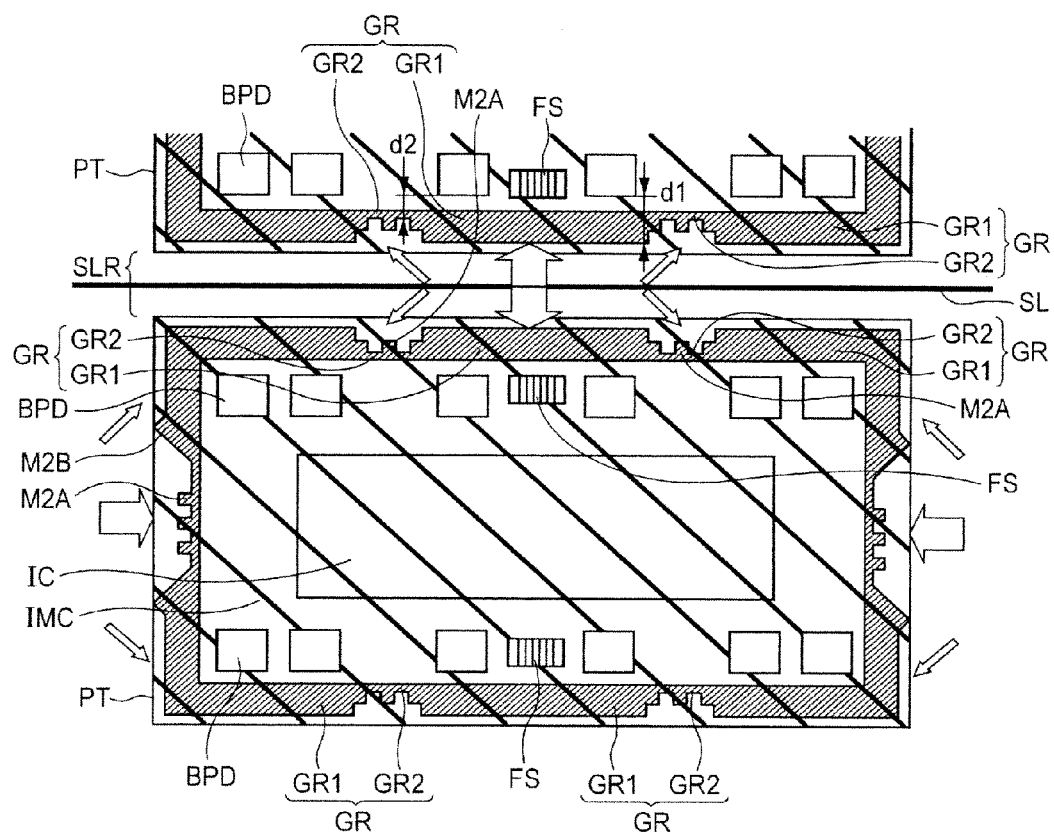
FIG. 10 is a schematic plan view showing an aspect where protective films are additionally drawn in the pattern of the uppermost layer of the multilayer structure of the semiconductor wafer where chip areas and a scribe line area are formed and where semiconductor apparatuses are disposed according to the first example of the third embodiment.
Figure 11:
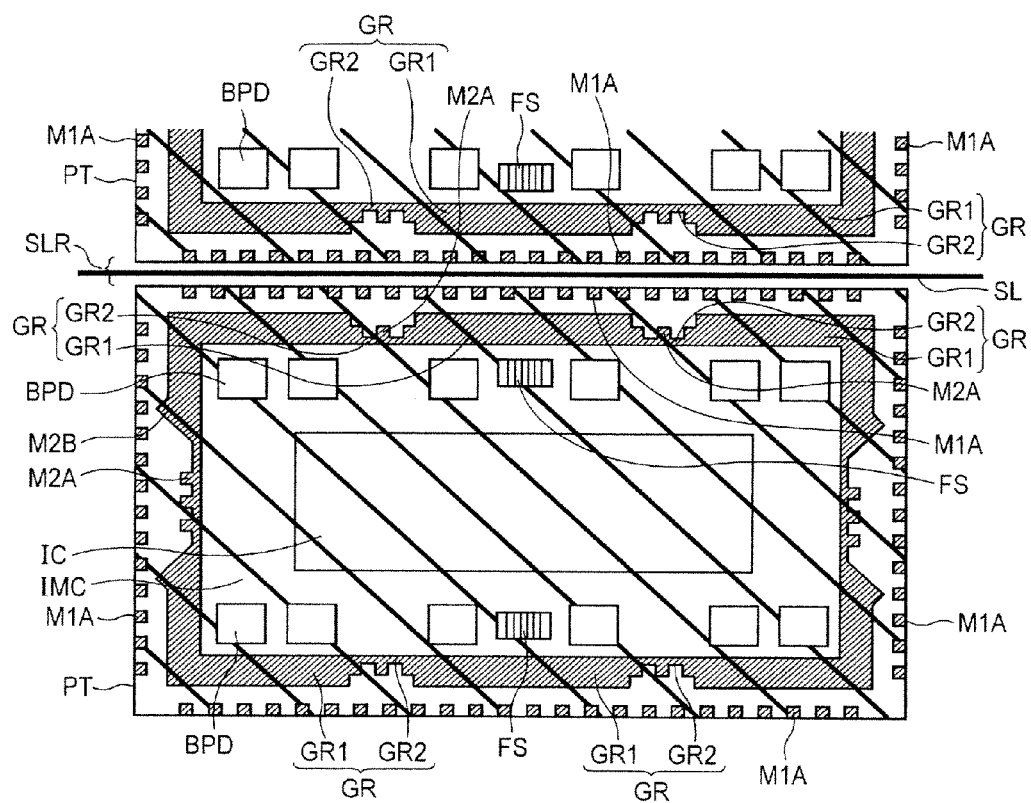
FIG. 11 is a schematic plan view showing the pattern of the uppermost layer of the multilayer structure of a semiconductor wafer where chip areas and a scribe line area are formed and where semiconductor apparatuses are disposed according to a second example of the third embodiment.

A third embodiment differs from the first embodiment in the area where the bonding pads BPD are formed and the configuration of the guard ring GR. Referring now to FIGS. 9 to 11, the configuration of this embodiment will be described.

FIG. 9 shows a first example of this embodiment where that fuse wires FS are disposed in parts of the area where the bonding pads BPD are disposed. FIG. 10 shows a state in which the protective film PT is formed above the semiconductor chip CHP shown in FIG. 9. The fuse wires FS are melted and cut upon receipt of a laser applied from above for purposes such as separating of a defective portion of the circuit from a normal portion thereof. Accordingly, as seen in FIG. 9, the protective film PT is not formed directly above the bonding pads BPD, nor directly above the fuses wire FS, and the surfaces of the fuse wires FS are exposed. That is, the protective film PT has apertures in the areas where the protective film PT overlaps the bonding pads BPD and the fuse wires FS in plan view.

In the uppermost layer of the area where a chip area IMC and the like are formed, of the semiconductor moisture according to this embodiment, the width (thickness) of the guard ring GR in an area opposed to an aperture of the protective film PT in plan view is larger than that of the guard ring GR in an area other than the area opposed to the aperture in plan view. That is, the guard ring GR includes a guard ring GR1 (a first protective wall) that includes areas opposed to a bonding pad BPD or fuse wire FS in the long-side direction or short-side direction (where no bonding pads BPD are shown) of the guard ring GR in plan view and a guard ring GR2 (a second protective wall) that includes areas not opposed to a bonding pad BPD or fuse wire FS in plan view. The guard ring GR1 is wider (thicker) than the guard ring GR2. Accordingly, the shortest distance d1 between a bonding pad BPD or fuse wire FS and the outermost side of the guard ring GR1 in the vertical direction of the figure is longer than the shortest distance d2 between a bonding pad BPD or fuse wire FS and the outermost side of the guard ring GR2 in the vertical direction of the figure.

In FIG. 9, there are small areas having no aperture between the fuse wires FS and the bonding pads BPD which are laterally adjacent to the fuse wires FS. The guard ring opposed to these areas has the same width as the guard ring GR1, which is opposed to the fuse wires FS and the like. On the other hand, in FIG. 9, the space between a bonding pad BPD adjacent to the left side of a fuse wire FS and a bonding pad adjacent to the left side of the bonding pad BPD is wider than the space between the fuse wire FS and the bonding pad BPD adjacent thereto. The guard ring opposed to the area having the wider space is the guard ring GR2, which is narrower (thinner) than the guard ring GR1.

That is, the areas where the guard ring GR1 having a larger width is formed are areas opposed to the apertures of the protective film PT and to areas adjacent to the apertures, of the guard ring GR, and the areas where the guard ring GR2 is formed are areas opposed to areas other than the apertures of the protective film PT and the areas adjacent thereto, of the guard ring GR. For example, a guard ring opposed to an area whose distance from an aperture for a fuse wire FS or bonding pad BPD is shorter than the length of one side of a bonding pad BPD in plan view is the guard ring GR1 having a larger width. The same goes for an area interposed between a pair of adjacent bonding pads BPD. For example, if the distance between the pair of bonding pads BPD is shorter than the length of one side of a bonding pad BPD, a guard ring opposed to this area is the guard ring GR1 having a larger width.

While description has been made with respect to the long-side direction of the guard ring GR (the horizontal direction of the figure), the same goes for the short-side direction thereof (the vertical direction of the figure). That is, a guard ring opposed to an aperture of the protective film PT for a bonding pad BPD or to an area adjacent to the aperture is the guard ring GR1 having a larger width, while a guard ring opposed to an area other than such areas is the guard ring GR2 having a smaller width.

In this embodiment, as in the first embodiment, the alignment marks M2A and M2B may be formed so as to contact at least parts of the guard ring GR (GR1, GR2) in the uppermost layer of the multilayer structure. For example, in FIG. 9, the alignment marks M2A and M2B are formed so as to contact the guard ring GR2.

Referring to FIG. 11, a semiconductor wafer according to a second example of this embodiment has a configuration where multilayer alignment marks M1A are formed in the scribe line area SLR located outside the guard ring GR1 of the semiconductor wafer according to the first example of this embodiment shown in FIGS. 9 to 10 in such a manner that the alignment marks M1A are spaced from the guard ring GR (that is, in such a manner that the alignment marks M1A do not contact the guard ring GR). The alignment marks M1A are disposed as in the second embodiment shown in FIG. 8. In FIG. 11, the protective film PT is formed so as to cover the chip area IMC from above, as well as so as to cover the guard ring GR and the alignment marks M1A from above.

As in the second embodiment, the protective film PT is formed so as to cover at least parts of the top surfaces of the alignment marks M1A (M1B), and the guard ring GR. More specifically, in FIG. 11, at least parts of the top surfaces of the alignment marks M1A (M1B) formed outside the guard ring GR1 so as to be opposed to apertures of the protective film PT in plan view are covered with the protective film PT. Note that the protective film PT is formed so as not to cover the entire scribe line area SLR (in particular, the area shown by the scribe line SL and to be cut by a dicing machine).

Except for the above-mentioned points, this embodiment has the same configuration as the first and second embodiments. Accordingly, the same components are given the same reference signs and will not be described again.

Next, advantageous effects of this embodiment will be described. This embodiment has the advantageous effects of the first and second embodiments, as well as the following advantageous effects.

In this embodiment, the guard ring GR includes the guard rings GR1 and GR2 having different widths in plan view. The guard ring GR1, which is wider than the guard ring GR2, is formed in an area opposed to an aperture of the protective film PT for a bonding pad BPD or fuse wire FS and in areas opposed to areas adjacent to the aperture.

Since the distance d1 is longer than the distance d2 in FIG. 9, the guard ring GR1 having a larger width can increase the protective effect of preventing entry of external moisture into a bonding pad or fuse wire FS inside the guard ring GR1, compared to the guard ring GR2 having a smaller width.

The existence of apertures of the protective film PT for the bonding pads BPD and the fuse wires FS increases the possibility that moisture will enter the multilayer structure circuit IC or the like from the apertures. For this reason, as in this embodiment, the guard ring GR1 is formed in areas adjacent to the apertures (areas opposed to the apertures) so as to be wider than the guard ring GR2 in the other areas. Thus, the possibility can reliably be reduced that moisture will enter from the apertures.

Further, by making the guard ring GR1 wider than the guard ring GR2 in areas opposed to the apertures of the protective film PT for the bonding pads BPD and the fuse wires FS and in areas adjacent to the areas, it is possible to disperse and reduce external stress applied to the guard ring GR1 (shown by thick arrows in FIGS. 9 to 11). This can control entry of moisture into the chip area IMC which is caused by formation of a crack in the guard ring GR1.

Further, in this embodiment, the protective film PT covers at least parts of the top surfaces of the alignment marks M1A (M1B) disposed so as to be opposed to areas where an aperture of the protective film PT is formed (areas adjacent to a fuse wire FS or bonding pad BPD). The protective film PT is away from the scribe line SL. Such a configuration can control occurrence of a crack in the protective film PT in areas between the end surface of the semiconductor chip CHP serving as the scribe line SL and the apertures of the protective film PT formed directly above the bonding pads BPD and the fuse wires FS when dividing and cutting the chip area IMC by dicing. This can further increase the effect of controlling entry of moisture into the chip area IMC (e.g., the multilayer structure circuit IC), for example, from the above-mentioned crack.

The third embodiment differs from the first and second embodiments in only the above-mentioned points. That is, the configuration, conditions, steps, advantages, and the like of the third embodiment that are not described above are all the same as those of the first and second embodiments.

Fourth Embodiment

A fourth embodiment differs from the third embodiment in that it includes marks having a shape for dispersing and reducing external stress. Referring now to FIGS. 12 to 15, the configuration of this embodiment will be described.

Figure 12:
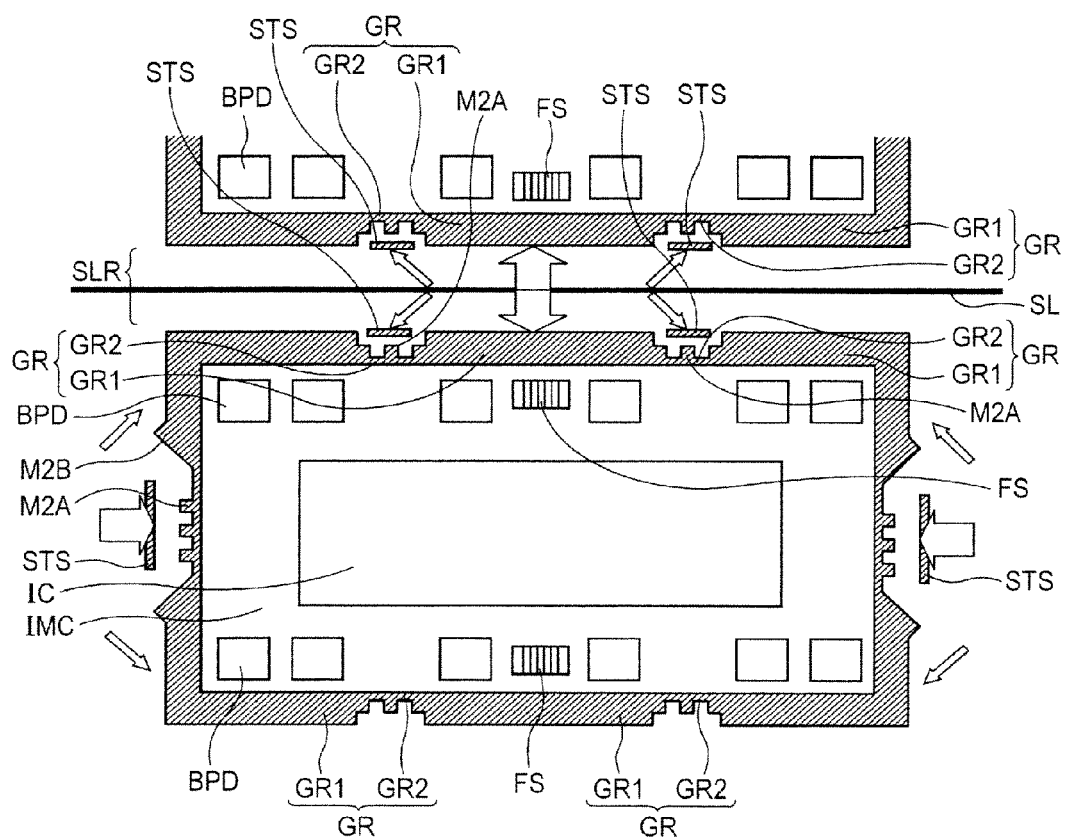
FIG. 12 is a schematic plan view showing the pattern of the uppermost layer of the multilayer structure of a semiconductor wafer where chip areas and a scribe line area are formed and where semiconductor apparatuses are disposed according to a first example of a fourth embodiment.

Referring to FIG. 12, metal wiring or the like in the uppermost layer of the area where chip areas IMC and the like are formed according to a first example of this embodiment has basically the same configuration as that according to the first example of the third embodiment shown in FIG. 9. In FIG. 12, however, stress relaxation units STS are formed outside of the guard ring GR (guard ring GR2) so as to be opposed to the guard ring GR2 in plan view.

As with the rectangular alignment marks M1A, the stress relaxation units STS are rectangular in plan view. As with the uppermost layers of the alignment marks M1A, M1B, M2A, and M2B and the guard ring GR, the stress relaxation units STS are preferably a pattern of a metal wiring layer made of aluminum or the like. The stress relaxation units STS are disposed outside the guard ring GR so as to be opposed to the guard ring GR including the guard rings GR1 and GR2 having different widths and in particular so as to be opposed to the guard ring GR2. That is, since the guard ring GR2 is narrower than the guard ring GR1, wider space than the width of the guard ring GR1 is formed in the width direction. For example, if the guard ring GR2 is disposed at a more internal position of the guard ring GR1 (a position closer to the chip area IMC), space is formed at a more external position of the rectangular guard ring GR1 (a position more distant from the chip area IMC). The stress relaxation units STS are formed so as to fill part of such space.

The alignment marks M2B or the like may be disposed so as to contact the guard ring GR2 opposed to the stress relaxation units STS.

Figure 13:
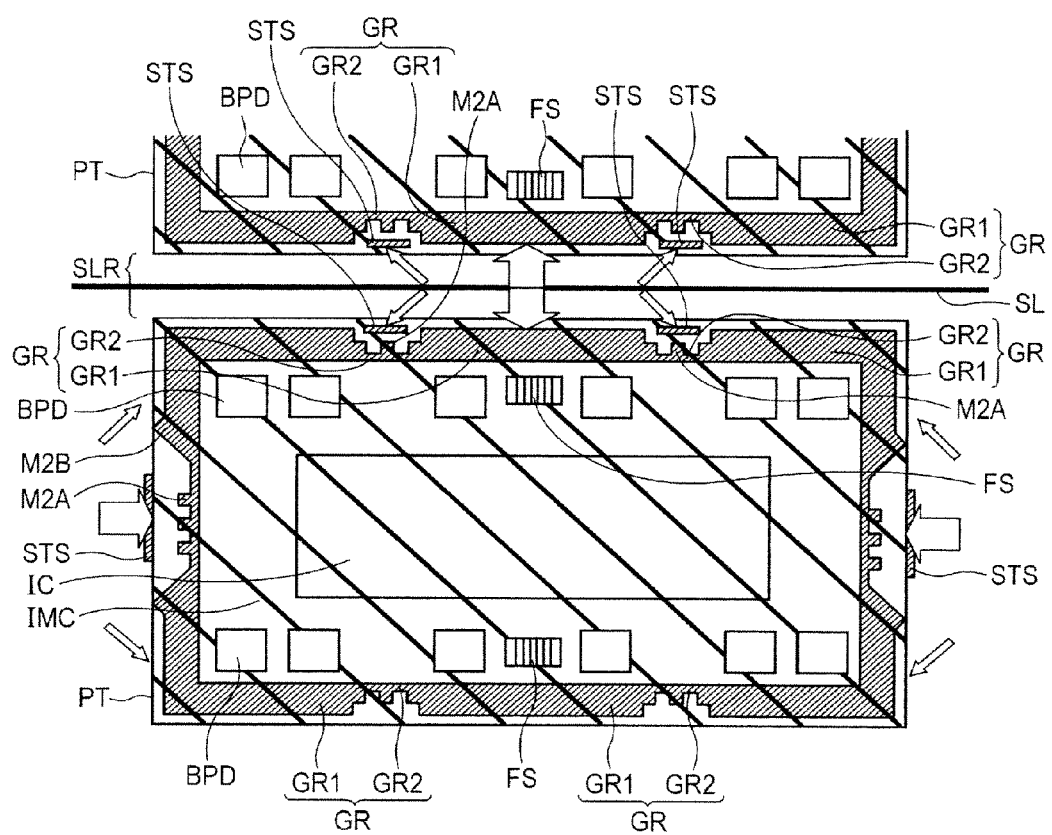
FIG. 13 is a schematic plan view showing an aspect where protective films are additionally drawn in the pattern of the uppermost layer of the multilayer structure of the semiconductor wafer where chip areas and a scribe line area are formed and where semiconductor apparatuses are disposed according to the first example of the fourth embodiment.

Referring to FIG. 13, if the protective film PT is formed so as to cover the multilayer structure circuit IC or the like in the uppermost layer from above in the first example of this embodiment shown in FIG. 12, the protective film PT may optionally cover the uppermost surfaces of the stress relaxation units STS. For example, the stress relaxation units STS opposed to the long-side direction of the guard ring GR of FIG. 13 (the horizontal direction of the figure) are covered with the protective film PT, while those opposed to the short-side direction (the vertical direction thereof) are not covered with the protective film PT.

Figure 14:
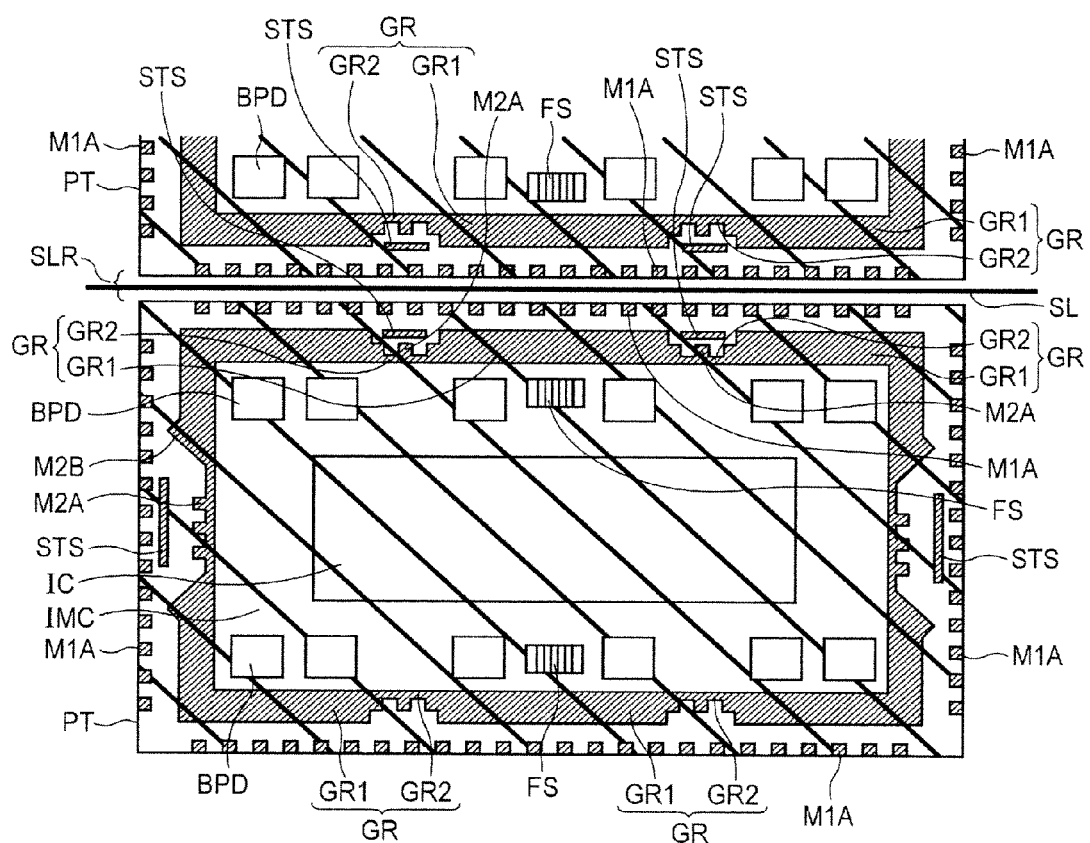
FIG. 14 is a schematic plan view showing the pattern of the uppermost layer of the multilayer structure of a semiconductor wafer where chip areas and a scribe line area are formed and where semiconductor apparatuses are disposed according to a second example of the fourth embodiment.

Referring to FIG. 14, a semiconductor wafer according to a second example of this embodiment has a configuration where multilayer alignment marks M1A are formed in the scribe line area SLR located outside the guard ring GR1 of the semiconductor wafer according to the first example of this embodiment shown in FIGS. 12 to 13 in such a manner that the alignment marks M1A are spaced from the guard ring GR (that is, in such a manner that the alignment marks M1A do not contact the guard ring GR). The alignment marks M1A are disposed as in the second embodiment shown in FIG. 8. In FIG. 14, the protective film PT is formed so as to cover the chip area IMC as well as the guard ring GR and the alignment marks M1A from above. As in the second embodiment, the protective film PT is formed so as to cover at least parts of the top surfaces of the alignment marks M1A (M1B), and the guard ring GR. As a result, the stress relaxation units STS (opposed to the short-side direction of the guard ring GR) which are not covered with the protective film PT in FIG. 13 are also necessarily covered with the protective film PT in FIG. 14. This is because the alignment marks M1A are disposed so as to be more external than the stress relaxation unit STS when seen from the guard ring GR and at least parts of the alignment marks M1A are covered with the protective film PT. Note that the protective film PT is formed so as not to cover the entire scribe line area SLR (in particular, the area shown by the scribe line SL and to be cut by a dicing machine).

Figure 15:
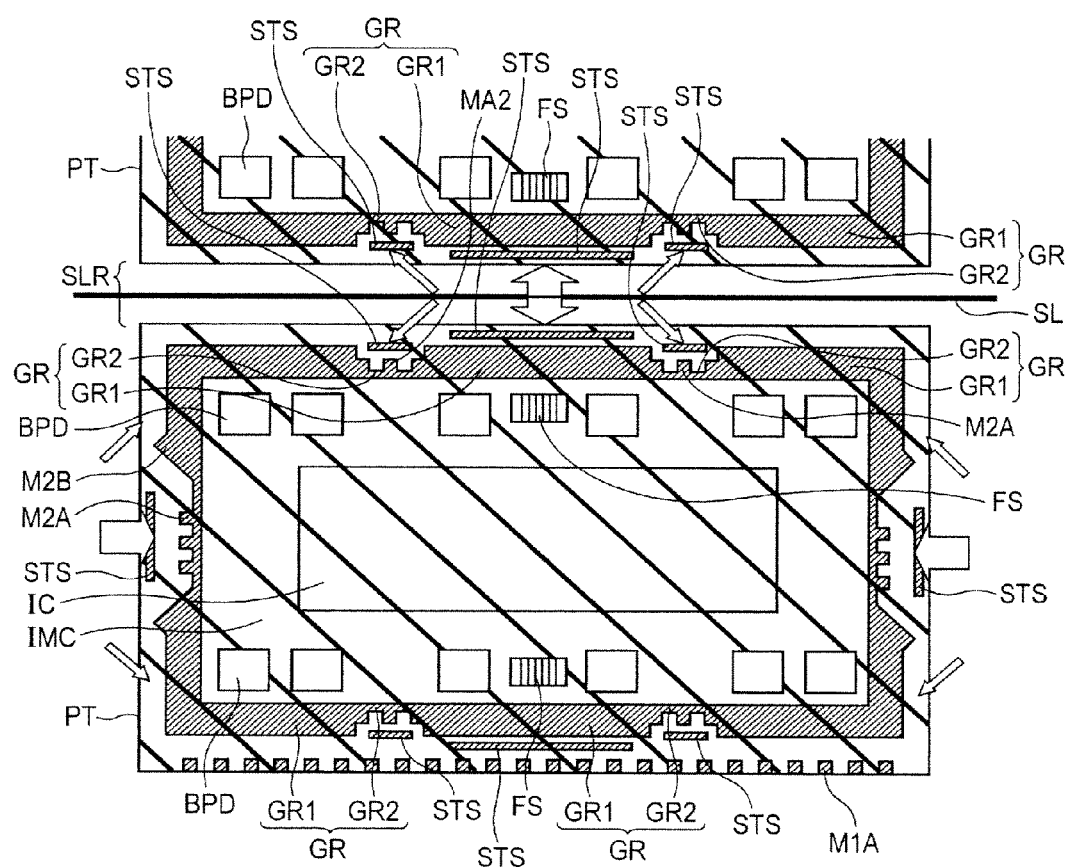
FIG. 15 is a schematic plan view showing the pattern of the uppermost layer of the multilayer structure of a semiconductor wafer where chip areas and a scribe line area are formed and where semiconductor apparatuses are disposed according to a third example of the fourth embodiment.

Referring to FIG. 15, a semiconductor wafer according to a third example of this embodiment has a configuration where additional stress relaxation units STS are formed over the semiconductor wafer of the second example of this embodiment shown in FIG. 14. Specifically, in FIG. 15, stress relaxation units STS are formed outside the guard ring GR (GR1) so as to be opposed to the guard ring GR1 in plan view. The stress relaxation units STS formed outside the guard ring GR1 have the same material and plan-view shape as the stress relaxation units STS formed outside the guard ring GR2.

Where stress relaxation units STS are disposed so as to be opposed to the guard ring GR1, the protective film PT is formed so as to cover at least parts of the top surfaces of the stress relaxation units STS opposed to the guard ring GR1.

In FIG. 15 also, alignment marks M1A, for example, may be formed (in such a manner that the alignment marks M1A are spaced from the guard ring GR). In this case, the protective film PT is formed so as to cover the top surfaces of the stress relaxation units STS opposed to the guard ring GR1, as well as at least parts of the top surfaces of the alignment marks M1A, and the guard ring GR. While, in FIG. 15, the alignment marks M1A are disposed in a fewer area than those in FIG. 14 (in a lower part of FIG. 15, which is a plan view), the alignment marks M1A may be disposed so as to surround approximately the entire perimeter of the guard ring GR, as in FIG. 14.

Except for the above-mentioned points, this embodiment has the same configuration as the third embodiment. Accordingly, the same components are given the same reference signs and will not be described again.

Next, advantageous effects of this embodiment will be described. The stress relaxation units STS according to this embodiment have a similar shape to the alignment marks M1B or the like and made of a similar material thereto. However, unlike alignment marks for LT such as the alignment marks M1B, the stress relaxation units STS have the function of dispersing and reducing external stress applied to the guard ring GR (shown by thick arrows in FIGS. 12 to 15).

Since the guard ring GR2 is narrower than the guard ring GR1, it may be impaired more easily. For this reason, stress relaxation units STS, which are a pattern of a metal wiring layer similar to the uppermost layer of the guard ring GR, are formed in the corresponding positions in order to compensate for the difference in width between the guard ring GR1 and the guard ring GR2. Thus, the stress relaxation units STS reinforce the guard ring GR2. As a result, even when the guard ring GR2 opposed to the areas where the stress relaxation units STS are formed is thin and vulnerable, the stress relaxation units STS reinforce the guard ring GR2. This can enhance the function of protecting the inside of the chip area IMC against external stress. Accordingly, the function of controlling such as entry of moisture into the chip area IMC can be secured.

As with the stress relaxation units STS disposed in the areas opposed to the guard ring GR2, the stress relaxation units STS disposed in the areas opposed to the guard ring GR1 in plan view can also enhance the effect of controlling such as entry of moisture into the chip area IMC from the guard ring GR1.

The areas where the guard ring GR1 is formed are opposed to the areas where an aperture of the protective film PT (for a fuse wire FS or bonding pads BPD) is formed. Accordingly, covering at least parts of the top surfaces of the stress relaxation units STS opposed to the guard ring GR1 with the protective film PT can more reliably reduce the possibility that moisture will enter from the aperture.

The fourth embodiment differs from the third embodiment in only the above-mentioned points. That is, the configuration, conditions, steps, advantages, and the like of the fourth embodiment that are not described above are all the same as those of the third embodiment.

Fifth Embodiment

A fifth embodiment differs from the fourth embodiment in the shape of alignment marks formed so as to contact the guard ring GR. Referring now to FIGS. 16 to 19, the configuration of this embodiment will be described.

Figure 16:
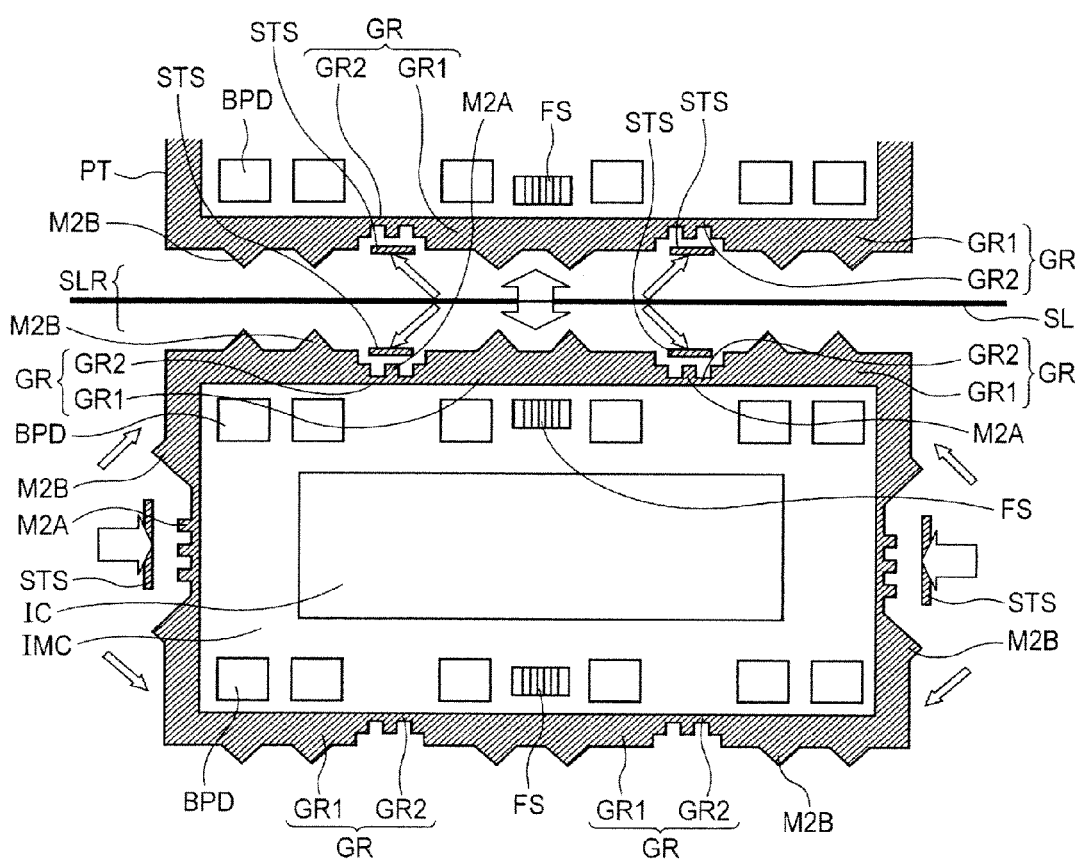
FIG. 16 is a schematic plan view showing the pattern of the uppermost layer of the multilayer structure of a semiconductor wafer where chip areas and a scribe line area are formed and where semiconductor apparatuses are disposed according to a first example of a fifth embodiment.

Referring to FIG. 16, metal wiring, the alignment marks, and the like in the uppermost layer of the area where chip areas IMC and the like are formed according to a first example of this embodiment have basically the same configuration as that according to the first example of the fourth embodiment shown in FIG. 12. In FIG. 16, however, the alignment marks M2B are formed so as to contact the guard ring GR in plan view. As with the alignment marks M2B of FIG. 2 according to the first embodiment, the alignment marks M2B of FIG. 16 are triangle in plan view and have a similar configuration to the alignment marks M2B of FIG. 2.

Figure 17:
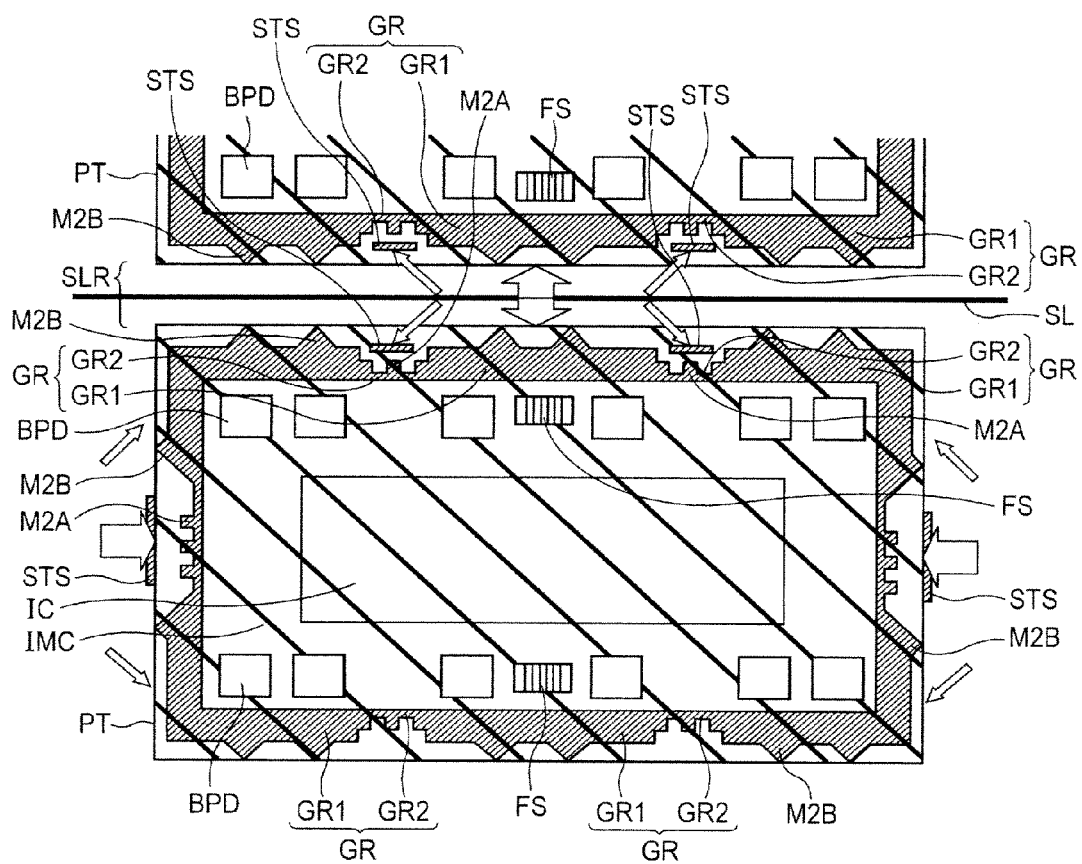
FIG. 17 is a schematic plan view showing an aspect where protective films are additionally drawn in the pattern of the uppermost layer of the multilayer structure of the semiconductor wafer where chip areas and a scribe line area are formed and where semiconductor apparatuses are disposed according to the first example of the fifth embodiment.

Referring to FIG. 17, if a protective film PT is formed so as to cover the multilayer structure circuit IC and the like in the uppermost layer from above in the first example of this embodiment shown in FIG. 16, the protective film PT covers the uppermost surface of the guard ring GR including the alignment marks M2A and M2B. This is similar to FIG. 3 according to the first embodiment. The protective film PT may be formed so as to cover the entire alignment marks M2B in plan view or may be formed so as to cover parts thereof in plan view. Note that the protective film PT is formed so as not to cover the entire scribe line area SLR (in particular, the area shown by the scribe line SL and to be cut by a dicing machine).

Figure 18:
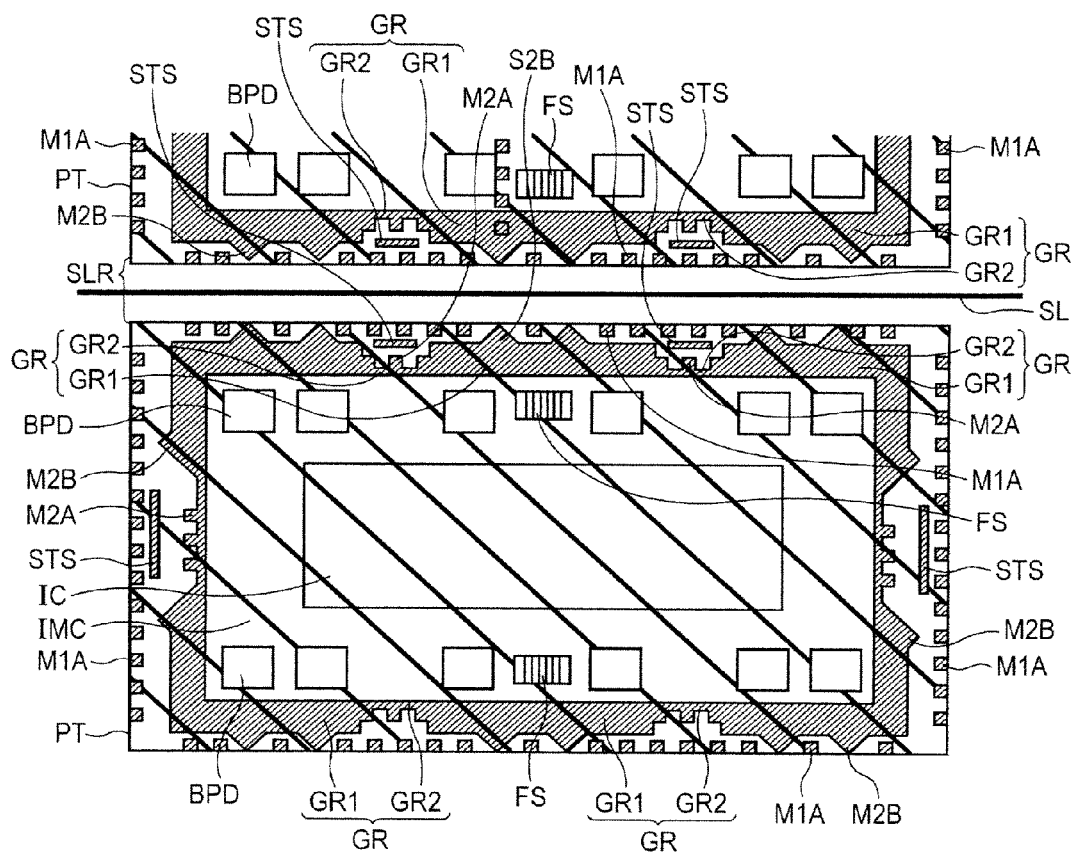
FIG. 18 is a schematic plan view showing the pattern of the uppermost layer of the multilayer structure of a semiconductor wafer where chip areas and a scribe line area are formed and where semiconductor apparatuses are disposed according to a second example of the fifth embodiment.

Referring to FIG. 18, a semiconductor wafer according to a second example of this embodiment has a configuration where multilayer alignment marks M1A are formed in the scribe line area SLR located outside the guard ring GR1 of the semiconductor wafer according to the first example of this embodiment shown in FIGS. 16 to 17, as in FIG. 14. In this regard, the semiconductor wafer of FIG. 18 differs from that of FIG. 17. The aspect where the protective film PT covers the multilayer structure circuit IC and the like in the uppermost layer is similar to that in FIG. 14.

Figure 19:
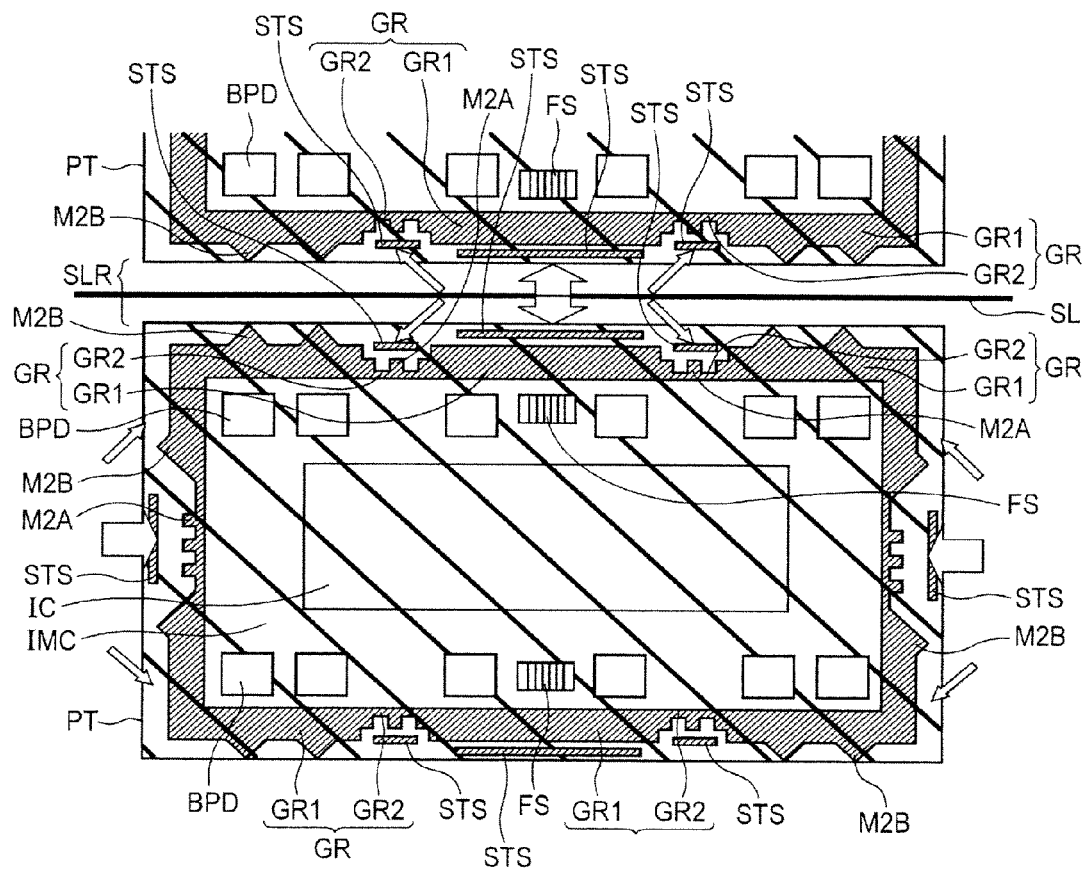
FIG. 19 is a schematic plan view showing the pattern of the uppermost layer of the multilayer structure of a semiconductor wafer where chip areas and a scribe line area are formed and where semiconductor apparatuses are disposed according to a third example of the fifth embodiment.

Referring to FIG. 19, a semiconductor wafer according to a third example of this embodiment has a configuration where additional stress relaxation units STS as in FIG. 15 (disposed so as to be opposed to the external side of the guard ring GR1 in plan view) are formed over the semiconductor wafer of the second example of this embodiment shown in FIG. 18. In this regard, the semiconductor wafer of FIG. 19 differs from that of FIG. 18. The aspect where the protective film PT covers the multilayer structure circuit IC and the like in the uppermost layer is similar to that in FIG. 15.

While alignment marks M2B are not formed in the areas overlapping the stress relaxation units STS in plan view in FIG. 19, they may be formed in these areas. Although not shown in FIG. 19, alignment marks M1A, for example, may be disposed (as in FIGS. 14 and 15).

This embodiment has the same configuration as the fourth embodiment except for the above-mentioned points. Accordingly, the same components are given the same reference signs and will not be described again.

Next, advantageous effects of this embodiment will be described. Even when the guard ring GR includes the guard ring GR1 and GR2 having different widths (thicknesses) as in this embodiment, triangular alignment marks M2B may be formed so as to contact at least parts of the guard ring GR. In this case also, the alignment marks M2B can enhance the effect of dispersing and reducing external stress applied to the guard ring GR (shown by thick arrows in FIGS. 16 to 19), as in the first embodiment.

The fifth embodiment differs from the fourth embodiment in only the above-mentioned points. That is, the configuration, conditions, steps, advantages, and the like of the fifth embodiment that are not described above are all the same as those of the fourth embodiment.

Sixth Embodiment

In any of the first to fifth embodiments, the patterns of the guard ring GR, the alignment marks, and the like formed in the same layer as the uppermost layer of the multilayer structure circuit IC formed over the semiconductor wafer SW have been described. However, a layer lower than the uppermost layer (a layer closer to the semiconductor substrate) of the multilayer structure circuit IC may also have a similar pattern to the uppermost layer. That is, in the lower layer also, similar patterns to the above-mentioned bonding pads BPD, the guard ring GR, and the alignment marks M1A, M1B, M2A, and M2B may be formed. The lower layer can also have similar advantageous effects to the first to fifth embodiments.

In this case, the alignment marks M1A, M1B, M2A, and M2B are alignment marks for overlay that are used to perform alignment when patterning an immediately higher layer (a layer more distant from the semiconductor substrate) than the layer in which these alignment marks are formed.

The embodiments disclosed herein should be construed as being illustrative and not limiting in all respects. The scope of the present invention is defined not by the above-mentioned description but by the claims and includes all changes without departing from the claims and meanings equivalent thereto.

The present invention can particularly advantageously be applied to semiconductor apparatuses including alignment marks, guard rings, and multilayer structure circuits.

What is claimed is:

1. A semiconductor apparatus comprising:
a semiconductor substrate having a main surface;
a multilayer structure circuit formed over the main surface of the semiconductor substrate;
a protective wall formed in the same layer as an uppermost layer of the multilayer structure circuit so as to surround the multilayer structure circuit in plan view; and
an alignment mark formed in the same layer as the uppermost layer,
a stress relaxation unit outside the protective wall in plan view,
wherein the alignment mark is formed so as to contact at least part of the protective wall.

2. The semiconductor apparatus according to claim 1, further comprising:
a protective film covering a top surface of the uppermost layer of the multilayer structure circuit,
wherein the protective film covers respective top surfaces of the protective wall, the alignment mark and the stress relaxation unit.

3. The semiconductor apparatus according to 2,
wherein the alignment mark comprises a plurality of alignment marks, and at least some of the alignment marks are triangular in plan view.

4. A semiconductor apparatus comprising:
a semiconductor substrate having a main surface;
a multilayer structure circuit formed over the main surface of the semiconductor substrate;
a protective wall formed in the same layer as an uppermost layer of the multilayer structure circuit so as to surround the multilayer structure circuit in plan view;
an alignment mark formed outside the protective wall in the same layer as the uppermost layer so as to be spaced from the protective wall; and
a protective film covering a top surface of the uppermost layer of the multilayer structure circuit,
a stress relaxation unit outside the protective wall in plan view,
wherein the alignment mark is formed so as to be spaced from a section of an edge of the semiconductor substrate, and
wherein the protective film covers at least part of a top surface of the alignment mark, and the protective wall.

5. The semiconductor apparatus according to claim 4,
wherein the protective wall covers at least part of a top surface of the stress relaxation unit.

* * * * *